(12) United States Patent
Horigome et al.

(10) Patent No.: US 8,765,605 B2
(45) Date of Patent: Jul. 1, 2014

(54) SURFACE TREATMENT FOR A FLUOROCARBON FILM

(75) Inventors: Masahiro Horigome, Yamanashi (JP);
Takuya Kurotori, Yamanashi (JP);
Yasuo Kobayashi, Yamanashi (JP);
Takaaki Matsuoka, Tokyo (JP);
Toshihisa Nozawa, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 264 days.

(21) Appl. No.: 13/138,242

(22) PCT Filed: Jan. 22, 2010

(86) PCT No.: PCT/JP2010/000347
§ 371 (c)(1),
(2), (4) Date: Sep. 12, 2011

(87) PCT Pub. No.: WO2010/084759
PCT Pub. Date: Jul. 29, 2010

(65) Prior Publication Data
US 2011/0318919 A1 Dec. 29, 2011

Related U.S. Application Data

(60) Provisional application No. 61/205,752, filed on Jan. 22, 2009, provisional application No. 61/207,971, filed on Feb. 17, 2009.

(51) Int. Cl.
*H01L 21/44* (2006.01)

(52) U.S. Cl.
USPC ..... 438/687; 438/625; 438/627; 257/E21.584

(58) Field of Classification Search
CPC ............... H01L 21/7861; H01L 21/76864; H01L 23/53238
USPC ............ 438/622–687; 257/E21.489, E21.584
See application file for complete search history.

(56) References Cited

U.S. PATENT DOCUMENTS

| | | | |
|---|---|---|---|
| 2002/0047203 A1* | 4/2002 | Akahori et al. | 257/753 |
| 2007/0228527 A1 | 10/2007 | Kobayashi | |
| 2010/0019356 A1* | 1/2010 | Kikuchi | 257/632 |
| 2011/0140276 A1 | 6/2011 | Ohmi | |

FOREIGN PATENT DOCUMENTS

| | | |
|---|---|---|
| CN | 1943021 A | 4/2007 |
| CN | 101238555 A | 8/2008 |
| JP | H11-297686 | 10/1999 |
| JP | 2001-284358 | 10/2001 |

* cited by examiner

*Primary Examiner* — Thanhha Pham
(74) *Attorney, Agent, or Firm* — Pearne & Gordon LLP

(57) ABSTRACT

A method for manufacturing semiconductor devices includes the steps of annealing an insulating layer and forming a barrier layer including a metal element over the insulating layer. The insulating layer includes a fluorocarbon (CFx) film. The barrier layer is formed by a high-temperature sputtering process after the annealing step.

40 Claims, 21 Drawing Sheets

FIG. 4

Blister, Tape test after 360c, 1hr

Structure: Cu 150nm / Ti 3nm / CFx 115nm / Si sub

| Treatment | wo | CO ANL 60s | CO Plasma 3kW 10s | Si2H6 ANL 60s | Ar ANL 60s | H2 ANL 900s | H2 Plasma 5s | Ca(OH)2 | Fluoro bonder Treatment |
|---|---|---|---|---|---|---|---|---|---|
| View after tape test | | | | | | | | | |
| blister | OK | OK | OK | OK | OK | OK | OK | OK | OK |
| Tape test | OK | OK | OK | OK | OK | OK | OK | OK | NG |

SEM after 360c, 1hr (1)

Fig. 9  Steam Pressure Curve for Fluoride

Fig. 13 Blister, Tape test & SEM after 350°C, 12hr

Blister, Tape test after 350°C, 12hr

| Layer | CFx | | Ti | | | Cu |
|---|---|---|---|---|---|---|
| Process | CFx | H2 ANL | PreHeat | Ti200C,Xs | PostHeat | Cu R.T,94s |
| Process Flow | CFx / Si sub | STG.Temp 300C,900sec | 200C,180sec | TiXnm / CFx / Si sub | 200C,180sec | Cu150nm / TiXnm / CFx / Si sub |
| Ti Time | 9 sec (1nm) | | 17 sec (4nm) | | | 25 sec (7nm) |
| View afterANL | | | | | | |
| Blister | Few | | OK | | | OK |
| Tape test | OK | | NG | | | OK |

Fig. 16 SEM after 350°C, 12hr

| Layer | CFx | | Ti | | Cu |
|---|---|---|---|---|---|
| Process | CFx | H2 ANL | PreHeat | Ti200C,Xs | PostHeat | Cu R.T. 94s |
| Process Flow | CFx / Si sub | STG.Temp. 300C, 900sec | 200C, 180 sec | TiXnm / CFx / Si sub | 200C, 180 sec | Cu150nm / TiXnm / CFx / Si sub |
| Ti Time | 9sec(1nm) | | 17sec(4nm) | | 25sec(7nm) | |
| Cross-section (×150k) | | | | | | |
| Surface (×50k) | | | | | | |

Fig. 17  Blister,Tape test after 350°C,12hr

| Structure | CF115<br>Si sub | Ti3nm<br>CF115<br>Si sub | Ti3nm<br>CF115<br>Si sub | | Cu150nm<br>Ti3nm<br>CF115<br>Si sub | |
|---|---|---|---|---|---|---|
| CFx Film | CFx | CFx2 | CFx | CFx2 | CFx | CFx2 |
| Ti Post-Heat time | | 360sec | | 180sec | | |
| Ti Post Treatment | | TEM | MEP2 O2 ANL300sec | | MEP2 Ar ANL600sec | |
| View | | | | | | |
| blister | OK | OK | OK | OK | OK | OK |
| Tape test | NG | OK | NG | OK | NG | OK |

Fig. 19 Annealing step comparison after 350°C, 12hr

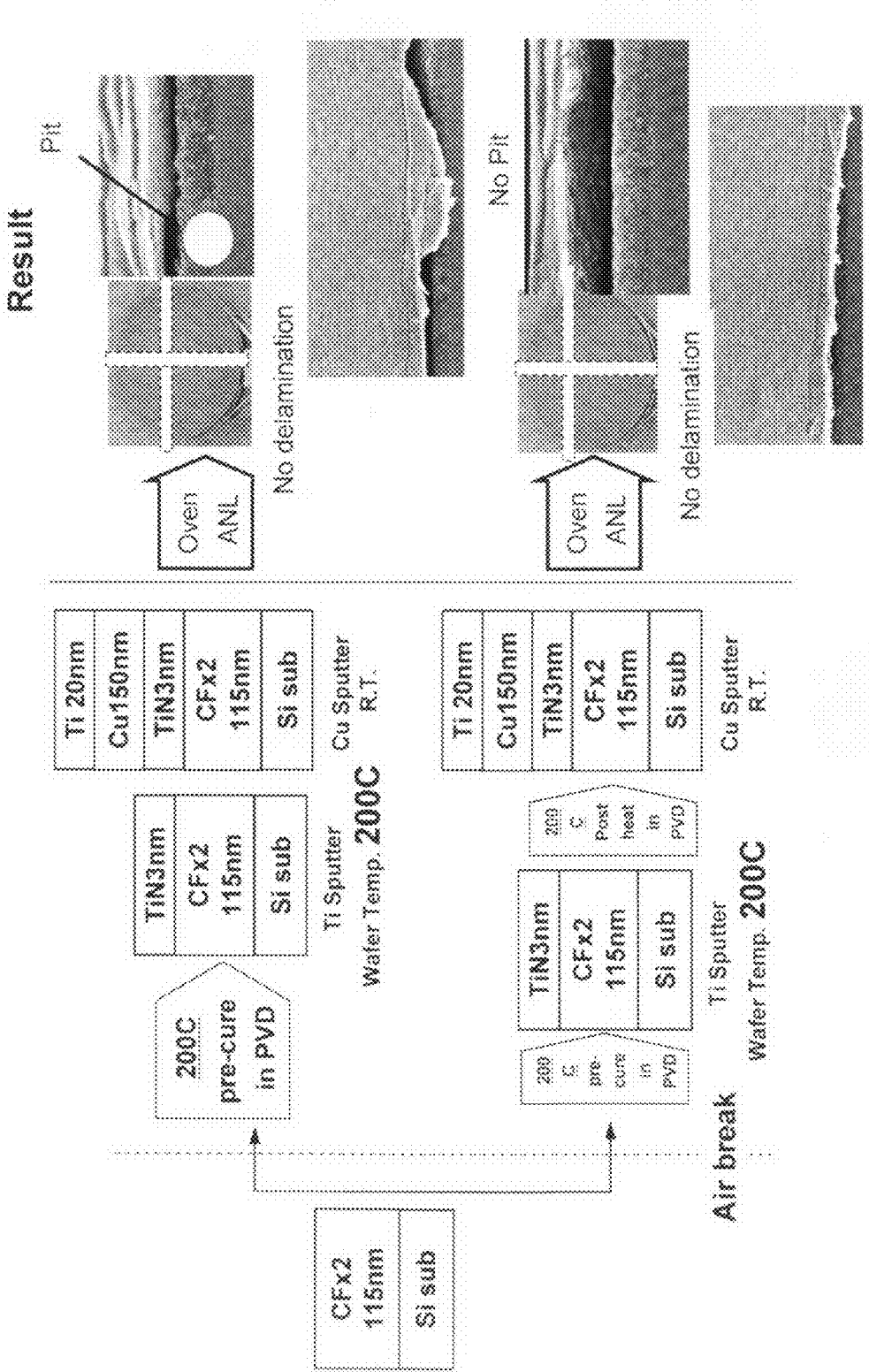

SURFACE TREATMENT FOR A FLUOROCARBON FILM

This application is a National Stage application under 35 U.S.C. §371 of International Application No. PCT/JP2010/000347, filed on Jan. 22, 2010, and claims priority from U.S. provisional application Ser. No. 61/205,752, filed Jan. 22, 2009, entitled "Surface Treatment for a Fluorocarbon Film" and U.S. provisional application Ser. No. 61/207,971, filed Feb. 17, 2009, entitled "Method for Metal Formation of CFx Film", which are hereby expressly incorporated by reference in their entirety for all purposes.

TECHNICAL FIELD

The present invention relates to semiconductor devices and their manufacturing methods. More specifically, it relates to surface treatment methods and a barrier layer forming method for improving the adhesiveness between an interlayer insulating layer, made of fluorocarbon (CFx), and the barrier layer made of metal.

BACKGROUND OF THE INVENTION

In recent years, multilayer wiring structures have been employed to achieve high speed operation and miniaturization of semiconductor devices. However, these structures have raised the problem of wiring delay due to an increase in the overall wiring resistance and parasitic capacitance of the wiring layers.

The use of low resistance wiring material, e.g. copper (Cu), as the interconnection body reduces the wiring resistance. On the other hand, low permittivity or low-k materials may be used to reduce the parasitic capacitance. Specially, fluorine added carbon (fluorocarbon: CFx) may be used as the insulating layer to reduce parasitic capacitance then to improve the operating speed of semiconductor devices.

To prevent copper (Cu) from diffusing into the insulating layer, a barrier layer is provided between the interconnection body and the insulating layer. The barrier layer of the semiconductor devices is made from titanium (Ti), tantalum (Ta), tungsten (W), ruthenium (Ru), or phosphorus (P).

When fluorocarbon (CFx) is used as the material for the insulating layer, the fluorine contained in the CFx layer causes fluorination reaction at the interface between the CFx layer and the barrier layer. As a result, the adhesiveness between the CFx layer and the barrier layer decreases, thereby the adhesiveness between the insulating layer and the interconnection body deteriorates consequently.

On the other hand, the fluorocarbon (CFx) material is required to have sufficient adhesiveness with a barrier layer which is mainly formed from a metal element. Since subsequent processes such as, for example, chemical and mechanical polishing (CMP) process or wire bonding process, are used in the manufacturing of semiconductor devices, further stress are applied onto the substrate. Therefore, the barrier layer may be peeled-off form the insulating layer if the adhesiveness is poor between the barrier layer and the CFx insulating layer.

The present invention is proposed in view of the above aforementioned problems. The present invention provides surface treatment methods to suppress the fluorination reaction at the interface between the insulating layer and the barrier layer. Further, the present invention provides a barrier layer forming method to increase the adhesiveness between the insulting layer and the barrier layer while suppressing the fluorination reaction there between.

SUMMARY OF THE INVENTION

In accordance with one aspect of the present invention, there is provided a method for manufacturing semiconductor devices. The method includes the steps of: annealing an insulating layer including a fluorocarbon (CFx) film; and forming a barrier layer including a metal element over the insulating layer, wherein the barrier layer is formed by a high-temperature sputtering process after said annealing step.

In accordance with a second aspect of the present invention, there is provided a method for manufacturing semiconductor devices. The method includes a step of conducting a pre-treatment process on an insulating layer so as to form a carbon-rich surface having a compositional ratio of carbon to fluorine (CT) more than 1. The insulating layer includes fluorocarbon with an arbitrary compositional ratio of carbon to fluorine (CFx) before conducting the pre-treatment process.

In accordance with a third aspect of the present invention, there is provided a method for manufacturing semiconductor devices. The method includes the steps of annealing an insulating layer under a predetermined condition while exposing a surface of the insulating layer to an inert gas atmosphere; and performing a high-temperature sputtering process after said annealing step so as to form a barrier layer including a metal element such that metal-C bonds are formed at an interface between the insulating layer and the barrier layer, wherein a substrate temperature is maintained at between about 70° C. and 200° C. during said high-temperature sputtering process. The annealing step further comprises a step of removing moisture from the surface of the insulating layer.

BRIEF DESCRIPTION OF THE DRAWINGS

FIG. 4 illustrates plan views of experimental samples, after applying adhesive tapes on their surface, and their blister and tape test results.

FIG. 14 illustrates a cross-sectional view and a surface view of an example of alternative experimental samples with their process flow, the blister test results, and the tape test results.

FIG. 15 illustrates target structure and process flow of another embodiment of experimental samples with their blister results and tape test results.

FIG. 16 illustrates a cross-sectional view and a surface view of experimental samples shown in FIG. 15.

FIG. 17 illustrates target structure and process flow of another embodiment of experimental samples, with their plan views after applying adhesive tapes, their blister test results and tape test results.

FIG. 21 illustrates a cross-sectional view and a surface view of yet another embodiment of experimental sample and its process flow.

DETAILED DESCRIPTION OF INVENTION

Figure 1:
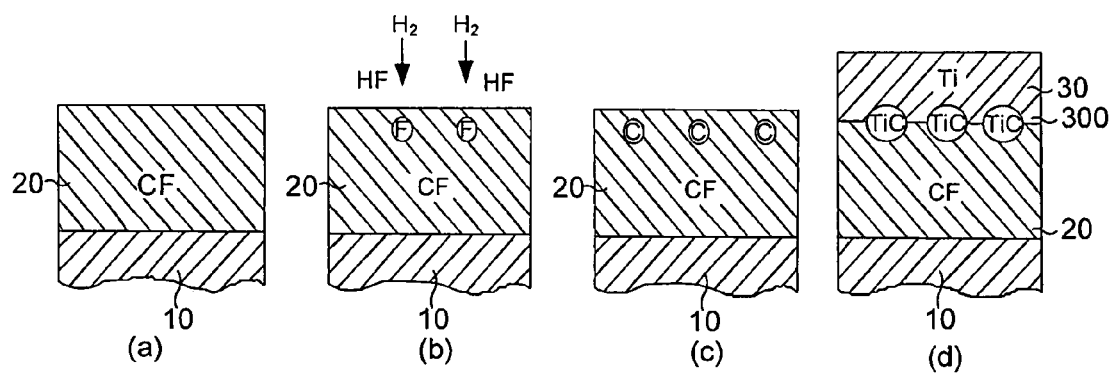
FIG. 1 depicts schematic diagrams of an embodiment of a CFx pre-treatment process using hydrogen plasma.

Embodiments of the present invention will be described hereinafter with reference to the accompanying drawings, in which preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing preferred exemplary embodiments of the disclosure. It should be noted that this invention may be embodied in different forms without departing from the spirit and scope of the invention as set forth in the appended claims.

This disclosure relates in general to semiconductor devices and their manufacturing process. More specifically, it relates to a new surface treatment process and barrier metal layer forming process to improve the adhesiveness between the insulating layer and the barrier metal layer.

Embodiments of the present invention are directed to a process for preventing the peeling-off of the barrier layer from the insulating layer and also preventing the penetration of the copper (Cu) from the interconnection body into the insulating layer. This is achieved through two separate methods: 1) a pre-treatment process applied to the surface of the insulating layer before forming the barrier layer and 2) forming the barrier layer using a high-temperature sputtering process.

By applying the pre-treatment process to the surface of fluorocarbon (CFx) insulating layer, fluorine concentration is reduced on the surface of the insulating layer. As a result, a carbon-rich surface is created on the surface of the CFx insulating layer, which helps in generating metal-C bonds when the barrier layer is formed over the surface of the insulating layer.

The high temperature used in forming the barrier layer mainly composed a metal element generates a fluorination reaction at the interface of the CFx layer and the barrier layer. Thereby, fluoride which has high steam pressure evaporates from the surface of the CFx insulating layer leading to an increase in carbon (C) concentration. As a result, the carbon-rich surface of the insulating layer helps to form metal-C bonds at the interface of the barrier layer and the insulating layer.

A process for manufacturing semiconductor devices according to the present invention comprises steps of; (1) forming a CFx insulating layer; (2) conducting a pre-treatment process to reduce fluorine concentration on the surface of the CFx layer; (3) pre-annealing the substrate; (4) forming the barrier layer containing a metal element using a high-temperature sputtering method; (5) post-annealing the substrate; (6) forming a copper (Cu) seed layer; and, (7) forming a copper (Cu) interconnection using an electrolytic plating method.

According to one embodiment of the present invention, the step of reducing fluorine concentration on the surface of the CFx layer is carried out by annealing the insulating layer under a predetermined condition while exposing the surface of the insulating layer to an inert gas atmosphere such as argon (Ar).

According to another embodiment, the step of reducing fluorine concentration on the surface of the CFx layer is carried out by annealing the insulating layer under a predetermined condition while exposing the surface of the insulating layer to a reactive gas atmosphere such as hydrogen ($H_2$).

According to yet another embodiment, the step of reducing fluorine concentration on the surface of the CFx layer is performed by applying a plasma treatment to the insulating layer. In this embodiment, the insulating layer is exposed to the plasma, which is generated by exciting a gas containing hydrogen ($H_2$) atoms or carbon (C) atoms under a predetermined condition.

According to yet another embodiment, the step of reducing fluorine concentration on the surface of the CFx layer is performed by dipping the insulating layer into a solution containing the hydroxide of a metal element, then washing the insulating layer with pure water and drying the insulating layer at the end.

According to yet another embodiment, the step of drying the insulating layer is performed using a conventional dryer or is carried out by air drying the insulating layer at room temperature.

According to yet another embodiment, the step of forming the barrier layer containing a metal element using a high-temperature sputtering method is carried out by maintaining the substrate temperature at a temperature ranging from about 70° C. to about 200° C. throughout the whole sputtering process.

In the following, the process used for manufacturing of semiconductor devices according to the present invention is explained in detail with sections individually describing: forming the fluorocarbon insulating layer; surface treatment of the insulating layer for reducing fluorine concentration on the surface of the CFx layer; pre-annealing the substrate; forming the barrier layer; post-annealing the substrate; forming the copper (Cu) seed layer; and forming the copper (Cu) interconnection layer. First, the process of forming a fluorocarbon (CFx) insulating layer will be described.

(Process of Forming the Fluorocarbon (CFx) Insulating Layer)

The insulating layer pertaining to the present invention is formed from a fluorocarbon (CFx: k~2.2) having an arbitrary ratio of carbon and fluorine. The fluorocarbon (CFx) insulating layer is provided on a surface of a substrate on which some micro structure such as transistors have been formed. The fluorocarbon (CFx) insulating layer is more dense compare to other low-k materials insulating layer such as, for example, porous materials. Therefore, the fluorocarbon (CFx) layer features higher mechanical strength. The desired thickness of the insulating layer to provide sufficient interconnections may be, for example, between about 100~120 nm. In this embodiment, a thickness of about 115 nm is targeted for forming the fluorocarbon (CFx) insulating layer.

The CFx insulating layer is formed using a radial line slot antenna microwave plasma treatment device with a predetermined setting condition. For example, in order to form a fluorocarbon insulating (CFx) layer with a thickness of about 115 nm an argon (Ar) gas with a flow rate of about 100 sccm is used as the plasma excitation gas. As for the forming gas a $C_5F_8$ gas with a flow rate of about 200 sccm is used. Inside of the radial line slot antenna microwave plasma treatment device is adjusted and maintained to a pressure of about 25 mTorr with an input power of about 1500 W. Since the CFx layers formed at relatively low temperature may be easily damaged, the wafer temperature is preferably maintained in a temperature ranging from 300~400° C. In this embodiment, the wafer state temperature is set to be about 350° C. Furthermore, the treatment time is set to 150 seconds and no bias is applied to the radial line slot antenna microwave plasma treatment device.

(Pre-Treatment Process for Reducing Fluorine Concentration of the CFx Layer)

In the conventional process used for manufacturing of semiconductor devices, the barrier layer is formed over the CFx insulating layer without performing any pre-treatment process. Therefore, the fluorine contained in the CFx insulating layer diffuses into the barrier layer causing a corrosion of the barrier layer due to the fluorination reaction at the interface of the barrier layer and the insulating layer. Thereby, copper (Cu) from the interconnection body diffuses into the insulating layer causing the peeling-off of the barrier layer from the insulating layer (CFx).

The reaction of fluorine from the insulating layer with the metal element from the barrier layer, fluorination reaction, may be suppressed by reducing fluorine concentration on the surface of the CFx insulating layer. This reduction leads to an increase in carbon (C) concentration on the surface of the CFx insulating layer, which results in turn in an increase in the ratio of bonding between the metal element and carbon atoms (carbide of the metal element) at the interface of the barrier layer and the insulating layer. Therefore, the adhesiveness between the CFx layer and the barrier layer is improved while peeling-off of the barrier layer due to corrosion is prevented. Furthermore, by forming the carbide of the metal element at the interface of the barrier layer and the insulating layer, the diffusion of copper (Cu) into the CFx insulating layer can be prevented.

There are several methods, according to the present invention, which use the above-mentioned mechanism to reduce fluorine concentration on the surface of the fluorocarbon (CFx) insulating layer. These methods are as follows: 1) hydrogen ($H_2$) annealing; 2) hydrogen ($H_2$) plasma treatment; 3) Washing with water after dipping into hydroxide of metal element; and 4) carbon monoxide (CO) plasma treatment. In the following, each of the above-mentioned process will be explained individually in detail.

1) Hydrogen ($H_2$) Annealing:

In this embodiment, the step of reducing fluorine concentration on the surface of the CFx layer is carried out by annealing the insulating layer under a predetermined condition while exposing the surface of the insulating layer to a reactive gas atmosphere such as, for example, hydrogen ($H_2$). In this embodiment, the step of annealing the insulating layer is performed at a temperature of about 100° C. or above by introducing the hydrogen ($H_2$) gas into the treatment device. Hydrogen ($H_2$) reacts with fluorine (F) on the surface of the CFx layer and becomes hydrogen fluoride (HF). Thereafter, hydrogen fluoride (HF) desorbs from the surface of the CFx layer, which results in generating a carbon-rich surface.

2) Hydrogen ($H_2$) Plasma Treatment:

Hydrogen ($H_2$) plasma treatment process is another method to decrease the fluorine concentration on the surface of the CFx insulating layer. Referring first to FIG. 1, an embodiment of a CFx pre-treatment process using hydrogen plasma is shown. The first portion of the process begins with forming a CFx insulating layer 20 on a substrate 10 (FIG. 1(a)). The CFx layer 20 may be formed by the same process explained in paragraphs [0025-0026] using the radial line slot antenna microwave plasma treatment device.

In the next step, hydrogen ($H_2$) gas is introduced into the treatment device and hydrogen plasma is generated by exciting the hydrogen ($H_2$) atoms using conventional method and devices. In this way, the CFx pre-treatment process is performed by exposing the fluorocarbon (CFx) insulating layer 20, formed over the substrate 10, to hydrogen plasma. As shown in FIG. 1(b), fluorine (F) contained in CFx surface layer is detached from said surface by reacting with the hydrogen plasma. Some embodiments may use other gases containing hydrogen atoms in addition to hydrogen ($H_2$) gas. Example of other gases containing hydrogen atoms may include silane gas ($SiH_4$) or methane gas ($CH_4$). Then, a carbon-rich surface is formed on the surface of the CFx layer (FIG. 1(c)).

FIG. 1(d) depicts the last step of process for manufacturing the semiconductor devices, after conducting the CFx pre-treatment process using the hydrogen plasma. In the last step, a barrier layer 30 is formed over the carbon-rich surface of the insulating layer 20. The barrier layer 30 is made essentially from a metal element such as, for example, titanium (Ti). The carbon-rich surface helps to increase the bonding between the barrier layer 30 and the insulating layer 20 by generating carbide of metal element 300. In this embodiment, the carbide of metal element 300 is made from carbide of titanium (TiC). In addition, the barrier layer 30 is formed using conventional methods such as, for example, a sputtering method or a chemical vapor deposition (CVD) method. Some embodiments may use other metal elements to form the barrier layer 30. Example of other metal elements may include tantalum (Ta), ruthenium (Ru), or tungsten (W).

Figure 2:
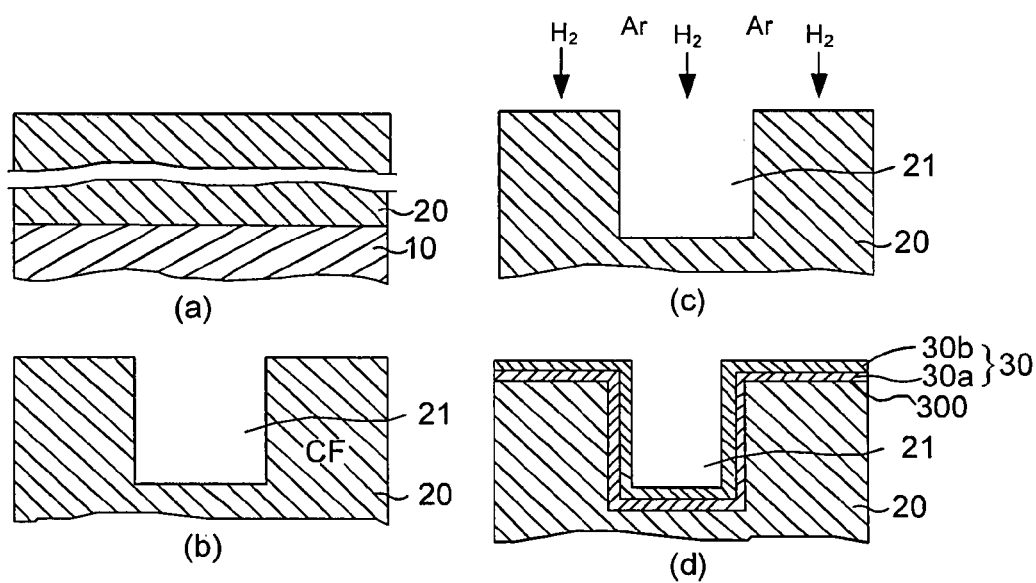
FIG. 2 depicts schematic diagrams of an alternative embodiment of a CFx pre-treatment process using hydrogen plasma.

Referring next to FIG. 2, an alternative embodiment of a CFx pre-treatment process using hydrogen plasma is shown. In this embodiment a single damascene type interconnection structure is used. After forming the CFx insulating layer 20 over the substrate 10, an opening 21 is formed, by an etching process, in the CFx insulating layer 30. In the next step, the insulating layer 20 is exposed to hydrogen plasma by introducing hydrogen ($H_2$) gas into the treatment device and performing the CFx pre-treatment process using excited hydrogen plasma. In this embodiment, an inert gas such as, for example, an argon gas (Ar) is added into the treatment device in addition to the hydrogen gas.

In the last step, the barrier layer 30 is formed on the inner side of the opening 21 and over the surface of the CFx layer 20. The barrier layer 30 has a multilayer structure having a first layer 30a formed over the CFx layer and a second layer 30b formed over the first layer. Example of metal elements used in the multilayer structure 30 may include titanium/titanium-nitride (Ti/TiN), titanium/tantalum-nitride (Ti/TaN), and tantalum/tantalum-nitride (Ta/TaN). As in the case of the first embodiment with hydrogen plasma treatment, the carbide of the metal element 300 is formed at the interface between the CFx insulating layer 20 and the barrier layer 30 due to the existence of the carbon-rich surface generated after conducting the CFx pre-treatment process using the hydrogen plasma.

3) Washing with Water After Dipping into Hydroxide of Metal Element:

In this embodiment, the CFx insulating layer is simply dipped into a solution containing hydroxide of a metal element. Examples of the metal element may include calcium (Ca), strontium (Sr), barium (Ba), sodium (Na), potassium (K), or magnesium (Mg). After dipping the insulating layer into the hydroxide of metal element such as, for example, hydroxide of calcium (ca(OH)2), the CFx insulating layer is washed with pure water and dried with a conventional method. In one embodiment, the drying step may be performed using a conventional dryer. In another embodiment, the drying step may be carried out by air drying the insulating layer at room temperature.

4) Carbon Monoxide (CO) Plasma Treatment:

In this method, the CFx pre-treatment process is performed using carbon monoxide (CO) plasma. Carbon (C) contained in the carbon monoxide (CO) plasma forms C—F bonds with the fluorine (F) contained in the CFx surface layer. The formation of C—F bonds causes fluorine (F) to desorb from the CFx surface layer. Therefore, other gases containing carbon atoms such as, for example, methane gas (CH4) and the like may also be used in addition to the carbon monoxide (CO) gas for this plasma treatment.

According to the methods based on plasma treatment (#2 and #4), the fluorine (F) contained in the CFx surface layer may be detached from said surface by exposing the CFx surface layer to a plasma which is generated by exciting a gas containing hydrogen ($H_2$) atoms or carbon (C) atoms. Therefore, any gas containing hydrogen atoms or carbon atoms may be added into the plasma treatment device in addition to the hydrogen ($H_2$) gas or carbon monoxide (CO) gas. Example of those gases may include silane gas (SiH4), methane gas (CH4) and the like.

The radial line slot antenna microwave plasma treatment device is used to generate the hydrogen ($H_2$) plasma or carbon monoxide (CO) plasma under a predetermined condition. For example, it is preferable that the pressure inside of the radial line slot antenna microwave plasma treatment device is adjusted to a pressure ranged between 100~2000 mTorr. In this embodiment, following conditions are used as the predetermined condition for generating both hydrogen ($H_2$) plasma and carbon monoxide (CO) plasma: first, the pressure inside of the radial line slot antenna microwave plasma treatment device is set to be about 1200 mTorr, second a microwave power of at least about 500 W is applied to the radial line slot antenna microwave plasma treatment device, and third the treatment time is set for a period of about 5 seconds.

As discussed above, the mechanism used in all of the above-mentioned methods is to suppress the fluorination reaction between fluorine (F) from the CFx insulating layer and the metal element from the barrier layer by reducing fluorine concentration. By suppressing the fluorination reaction, the fluorine concentration on the surface of the CFx layer is reduced thereby a carbon-rich surface is generated on the surface of the CFx layer. Consequently, when forming a barrier layer on the carbon-rich surface, the ratio of bonding between the metal element and carbon atoms (carbide of the metal element) is increased at the interface of the barrier layer and the insulating layer.

5) Argon (Ar) Annealing Treatment:

In an alternative embodiment, a different mechanism may be used to decrease the fluorine concentration on the surface of the CFx insulating layer. In this alternative embodiment, moisture on the surface of the fluorocarbon (CFx) insulating layer is removed using an argon (Ar) annealing treatment. Moisture on the surface of the CFx layer creates fluorine with weak bonds. The fluorine atoms with weak bonds form a metal element tetra-fluoride such as, for example, titanium tetra-fluoride ($TiF_4$) at the interface between the barrier layer and the CFx insulating layer. The titanium tetra-fluoride ($TiF_4$) features a high vapor pressure which results in deteriorating the adhesiveness between the CFx insulating layer and the metal element. Therefore, removing moisture by argon (Ar) annealing treatment helps to reduce fluorine with the weak bonds from the surface of the fluorocarbon (CFx) insulating layer and thereby creating a carbon-rich surface thereupon.

In this alternative embodiment, it is desirable that the annealing step is performed under a predetermined condition in an inert gas atmosphere. Examples of the inert gas atmosphere may include helium (He), neon (Ne), argon (Ar), krypton (Kr), xenon (Xe) and the like. In this embodiment, argon (Ar) gas is used as annealing gas, from view point of economic efficiency, for annealing the CFx insulating layer.

A sputtering device is used to perform the argon (Ar) annealing treatment of the present invention. However, an annealing device separate from the sputtering device may also be provided. As discussed above, a predetermined condition is used to perform the argon (Ar) annealing treatment. For example, it is preferable that the pressure inside of the sputtering device is adjusted to a pressure ranged between 100 mTorr to 1 Torr. In this embodiment, the pressure inside of the sputtering device is set to be about 10 mTorr while the state temperature is set to be about 200° C. Also, the treatment time is set for a period of about 5 minutes (300 sec).

Figure 3:
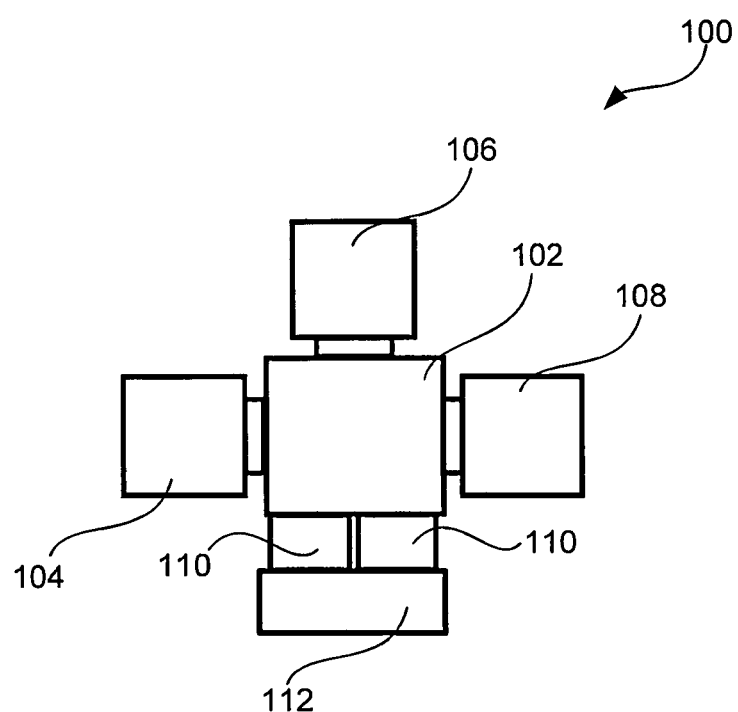
FIG. 3 depicts a schematic diagram of an embodiment of a sputtering device.

With Reference to FIG. 3, a schematic diagram of an embodiment of a sputtering device 100 is shown. As shown in this figure, on the center of the sputtering device, a vacuum transfer chamber 102 is provided. In the surrounding area, an annealing chamber 104, a barrier layer sputtering chamber 106, and a copper sputtering chamber 108 are configured around the vacuum transfer chamber 102. On the lower side of the sputtering device 100, at least one load lock chamber 110 is connected to the vacuum transfer chamber 102, and a transfer chamber 112 is connected to the load lock chamber 110 for transferring wafers from the cassette (not shown) to the load lock chamber 110.

Experimental Samples:

In order to evaluate the barrier property and also the adhesion of a barrier layer on a pre-treated fluorocarbon (CFx) insulating layer, several experimental samples are manufactured. Then, the experimental samples are subjected respectively to the blister test and the tape test. FIG. 4 illustrates the structure and process used for surface treatment of CFx insulating layer in each of the experimental samples. In addition, a plan view of the experimental samples, after adhering scotch tapes to their surface, and the results of blister test and tape test are shown in this figure. The structure used for this evaluation includes a fluorocarbon (CFx) insulating layer formed on a bulk silicon (Si) substrate.

The fluorocarbon (CFx) insulating layer has a thickness of about 115 nm and is formed using the process explained in the radial line slot antenna plasma treatment device. After performing the CFx Pre-treatment process on the surface of the CFx insulating layer in each of the experimental samples, a barrier layer mainly composed of titanium (Ti) with a thickness of about 3 nm is formed over the CFx insulating layer using the sputtering device 100, in which titanium (Ti) is used as a sputtering target. In the last step, a copper (Cu) interconnection layer with a thickness of about 150 nm is formed over the barrier layer using the sputtering device 100.

The barrier layer of the experimental samples may be formed using a conventional sputtering method or a chemical vapor deposition (CVD) method or an electrolytic plating method. Prior to forming the barrier layer, an annealing step may be performed, if necessary, to remove the moisture or organic substances. This annealing is conducted in a barrier layer forming chamber of the sputtering or CVD device at a temperature ranging from about 100° C. to about 200° C.

Nine different experimental samples are manufactured for this evaluation. For each experimental sample, a separate CFx pre-treatment process is conducted on the surface of CFx insulating layer for reducing the fluorine concentration of said surface, while increasing the relative carbon concentration thereupon. As shown in FIG. 4, the treatment row summarizes the surface treatment process applied on the surface of the CFx insulating layer in each experimental sample.

(Experimental sample 1): No pre-treatment process is conducted on the surface of the CFx insulating layer. As shown in FIG. 4, it is determined that this sample, which is indicated by "wo" symbol, passed both the blister test and the tape test. In this embodiment, the ratio of carbon to fluorine to oxygen is as follows: C:F:O=47:53:0.

(Experimental sample 2): The fluorocarbon (CFx) insulating layer of this experimental sample is treated by the carbon monoxide (CO) annealing process. In this embodiment, the carbon monoxide (CO) gas is introduced into the treatment device and the annealing is performed at a temperature of about 200° C. for a period of about 60 seconds. Similar to the previous case, this sample (#2) passed the blister test and the tape test.

(Experimental sample 3): The carbon monoxide (CO) plasma treatment is applied on to the surface of the fluorocarbon (CFx) insulating layer. The radial line slot antenna microwave plasma treatment device is used to perform the carbon monoxide (CO) plasma treatment. In this embodiment, the microwave power of about 3 kW is applied to the radial line slot antenna microwave plasma treatment device and the treatment time is set for a period of about 10 seconds. The pressure inside of the radial line slot antenna microwave plasma treatment device is set to be about 1200 mTorr. Similar to the previous cases, the experimental sample #3 passed both the blister test and the tape test. In this embodiment, the ratio of carbon to fluorine to oxygen is as follows: C:F:O=48:46:6.

(Experimental sample 4): In this experimental sample, the step of reducing the fluorine concentration on the surface of the CFx layer is carried out by annealing the insulating layer while exposing the surface of the insulating layer to Disilane ($Si_2H_6$) gas. In this embodiment, disilane ($Si_2H_6$) gas is introduced into the treatment device and the annealing step is performed at a temperature of about 200° C. for a time period of about 60 seconds. This experimental sample passed both the blister test and the tape test.

(Experimental sample 5): The surface of the CFx insulating layer is pre-treated using the argon (Ar) annealing treatment. As discussed previously, the argon (Ar) annealing treatment is performed in the sputtering device 100 where the annealing step and sputtering step may be performed within the same treatment device. However, an annealing device separate from the sputtering device may also be used for this embodiment. The pressure inside of the sputtering device is set be about 10 mTorr and the substrate temperature is maintained at a temperature of about 200° C. The treatment time for this experimental sample is set to be about 60 seconds. Similar to the previous cases, the experimental sample #5 passed both the blister test and the tape test.

(Experimental sample 6): The surface of the CFx insulating layer is pre-treated by hydrogen ($H_2$) annealing process. The annealing step for this experimental sample is performed at a temperature of about 300° C. for a time period of about 900 seconds. The experimental sample #6 passed both the blister test and the tape test. In this embodiment, the ratio of carbon to fluorine to oxygen is as follows: C:F:O=50:50:0.

(Experimental sample 7): The hydrogen ($H_2$) plasma treatment is applied on to the surface of the fluorocarbon (CFx) insulating layer. Similar to the case of the experiment sample #3, the radial line slot antenna microwave plasma treatment device is used to perform the hydrogen ($H_2$) plasma treatment. In this embodiment, the microwave power of at least about 500 W is used and the treatment time is set for a period of about 5 seconds. As described previously, the pressure inside of the radial line slot antenna microwave plasma treatment device is set to be about 1200 mTorr. As shown in FIG. 4, some stripping is observed with this experimental sample (#7). In this case, further investigations showed that those stripping were due to some environmental conditions, therefore it is determined that this sample passed the blister test and the tape test, similar to the previous cases. In this embodiment, the ratio of carbon to fluorine to oxygen is as follows: C:F:O=55:45:0.

(Experimental sample 8): The CFx insulating layer is first dipped into calcium hydroxide ($Ca(OH)_2$) solution. After the dipping step, the CFx insulating layer is washed with pure water and air dried at room temperature. The experimental sample #8 passed both the blister test and tape test. No data is available with regards to the ratio of carbon to fluorine to oxygen in the cleansing treatment with hydroxide of metal element.

(Experimental sample 9): The CFx insulating layer is pre-treated by the fluorobonder treatment. As shown in FIG. 4, this experimental sample passed the blister test, however it failed the tape test so demonstrating low adhesion bonding between the barrier layer and the CFx insulating layer.

According to the above experimental results shown in FIG. 4, all the experimental samples, except the sample with fluorobonder treatment, demonstrate high adhesion bonding between the barrier layer and the CFx insulating layer. However, the Peeling of the barrier layer is possible in the experimental sample #9 with fluorocarbon treatment due to the low adhesion bonding.

Figure 5:
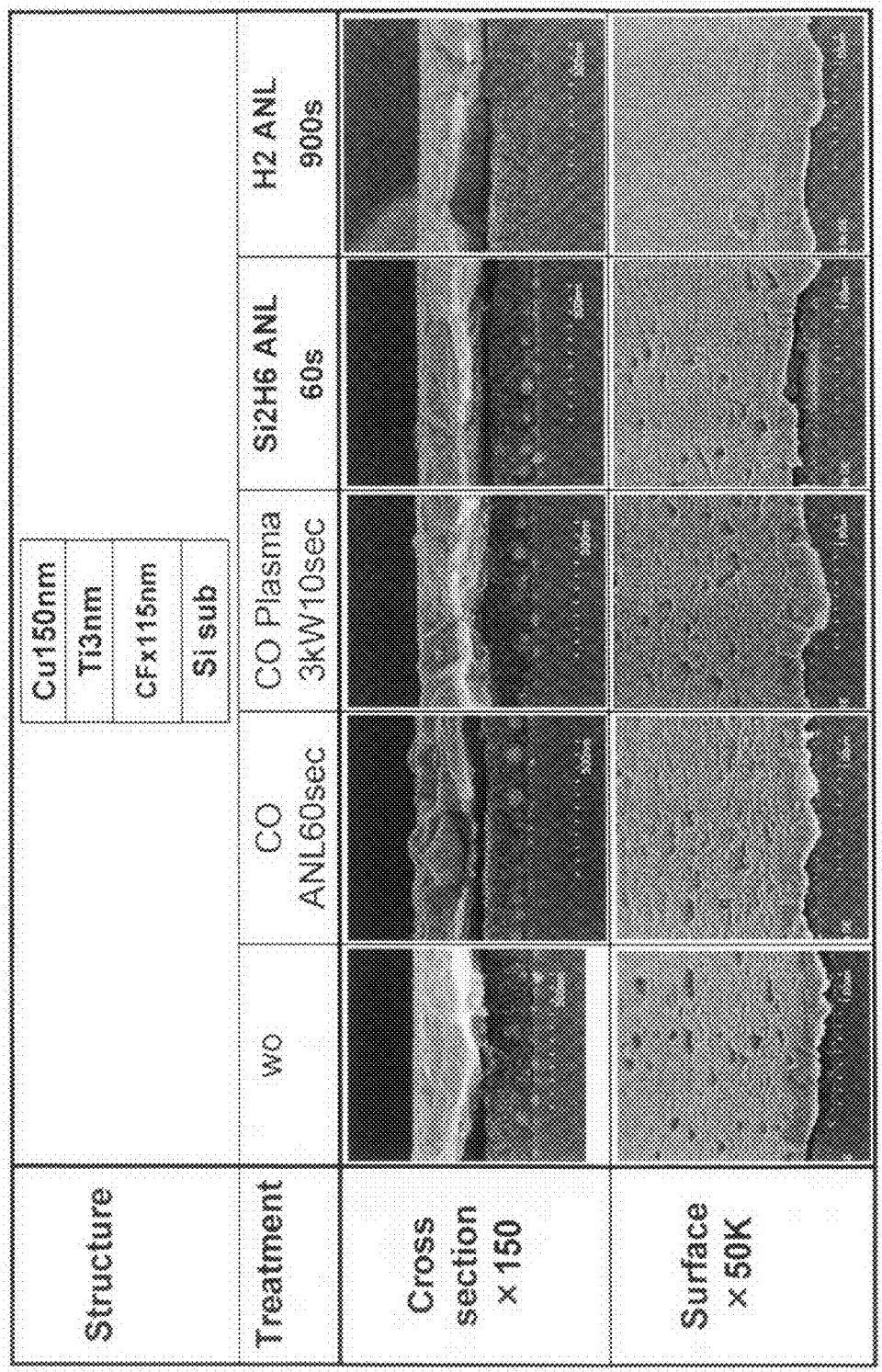
FIG. 5 illustrates cross-sectional views and surface views of the first half of experimental samples shown in FIG. 4.
Figure 6:
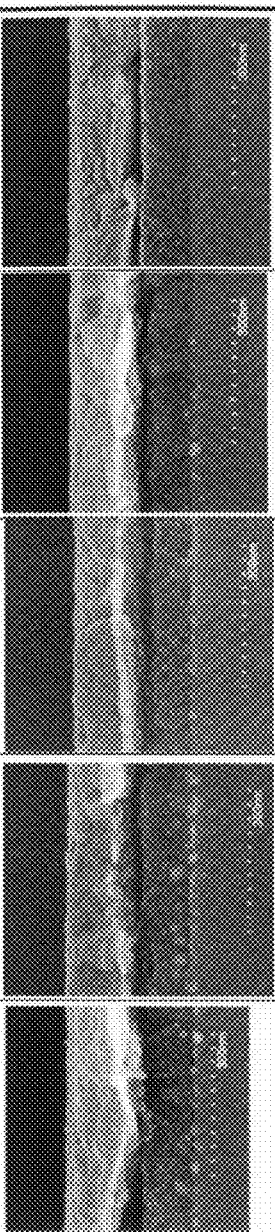
FIG. 6 illustrates cross-sectional views and surface views of the second half of experimental samples shown in FIG. 4.

With reference to FIGS. 5-6, a cross-sectional view and a top surface view, for each of the experimental samples #1 to #9, using a scanning electron microscope (SEM) image are shown. The SEM image is taken after annealing all the experimental samples at a temperature of about 360° C. for a time period of about 1 hour. As shown in FIGS. 5 & 6, the experimental sample #1, with no pre-treatment process applied onto the CFx insulating layer, shows no peeling of the barrier layer from the CFx layer. However, this sample shows some issue with regards to the barrier property.

As shown on the cross-sectional view, the presence of bright grains at the interface of the CFx insulating layer and the silicon (Si) substrate demonstrates that copper (Cu) from the copper interconnection body passes respectively through the barrier layer and the CFx insulating layer. Therefore, copper (Cu) bonds with the silicon (Si) substrate and generates SiCu. With regards to the top surface view of the experimental sample #1, the existence of more dents and raise demonstrates more copper (Cu) penetration into the lower layers of structure.

Bright grains are shown in almost all the experimental samples except in the case of experimental sample #6 where the hydrogen ($H_2$) annealing treatment is applied on to the surface of the CFx insulating layer. Furthermore, no dent is present on the copper (Cu) surface. In addition, the cross-sectional view and the surface view of the experimental sample #9 with fluorobonder treatment look also favorable with regards to the presence of the bright grains at the interface of the silicon (Si) substrate and the CFx insulating layer and also with regards to the existence of dents on the copper (Cu) surface. However, the adhesiveness of the CFx/metal interface is poor for the experimental sample #9 as shown in FIG. 4 with respect to the blister test and tape test results.

It should be noted that all the experimental samples with fluorine reduction treatment have sufficient barrier property with regards to the diffusion of copper (Cu) into the silicon (Si) substrate layer. This is in spite of the existence of bright grains at the Si/CFx interface and also existence of dents on the copper (Cu) surface.

(Pre-Annealing the Substrate)

In what follows, the third step of the process used for manufacturing of semiconductor devices according to the present invention will be explained. After applying the pre-treatment process on the fluorocarbon (CFx) insulating layer, a pre-heating step is performed on the substrate using the sputtering device 100. This heat treatment may be performed in the barrier layer deposition chamber 106 at a substrate temperature ranging from about 50° C. to about 200° C. The treatment time may be set to 180 seconds or less.

(Process of Forming the Barrier Layer Mainly Composed of a Metal Element)

In the conventional barrier layer forming process, there has been a problem in that the adhesiveness between the CFx insulating layer and the barrier layer mainly composed of the metal element, such as for example, titanium (Ti), is poor. To improve the adhesiveness, a double (multiple) barrier layer structure is proposed in that a first layer made of titanium-nitride (TiN) is formed on the insulating layer and a second layer made of titanium (Ti) is formed over the first layer facing the copper interconnection. However, the use of titanium-nitride (TiN) in the barrier layer will increase the signal delay due to its high electric resistance.

The barrier layer mainly composed of the metal element according to the present invention is formed using a high-temperature sputtering method. In this process the substrate temperature is maintained at a relatively high temperature throughout the whole sputtering process. In the preferred embodiment, the substrate temperature is heated and maintained at a temperature ranging from about 70° C. to about 200° C. By heating the substrate to the above-mentioned temperature range and keeping the substrate temperature at the same level during the entire sputtering process, fluorine atoms are scavenged as a TiF4, for example, because of high vapor pressure from the surface of the fluorocarbon (CFx) insulating layer.

The reason for choosing the lower limit of the preferred temperature range at 70° C. is the fact that moisture on the surface of the fluorocarbon (CFx) insulating layer begins to evaporate in vacuum at this temperature. On the other hand, the upper limit temperature range is set to 200° C. because copper (Cu) of the underlying conductive layer starts to aggregate when the substrate temperature exceeds 200° C. This is mainly due to the fact that copper (Cu), which is exposed at the bottom of a via hole, is directly affected by the substrate temperature. Therefore, when the substrate temperature exceeds the upper limit range, copper (Cu) from the conductive layer begins to aggregate. The aggregated copper is not uniform in its properties, which makes it difficult to be used in semiconductor devices.

Figure 7:
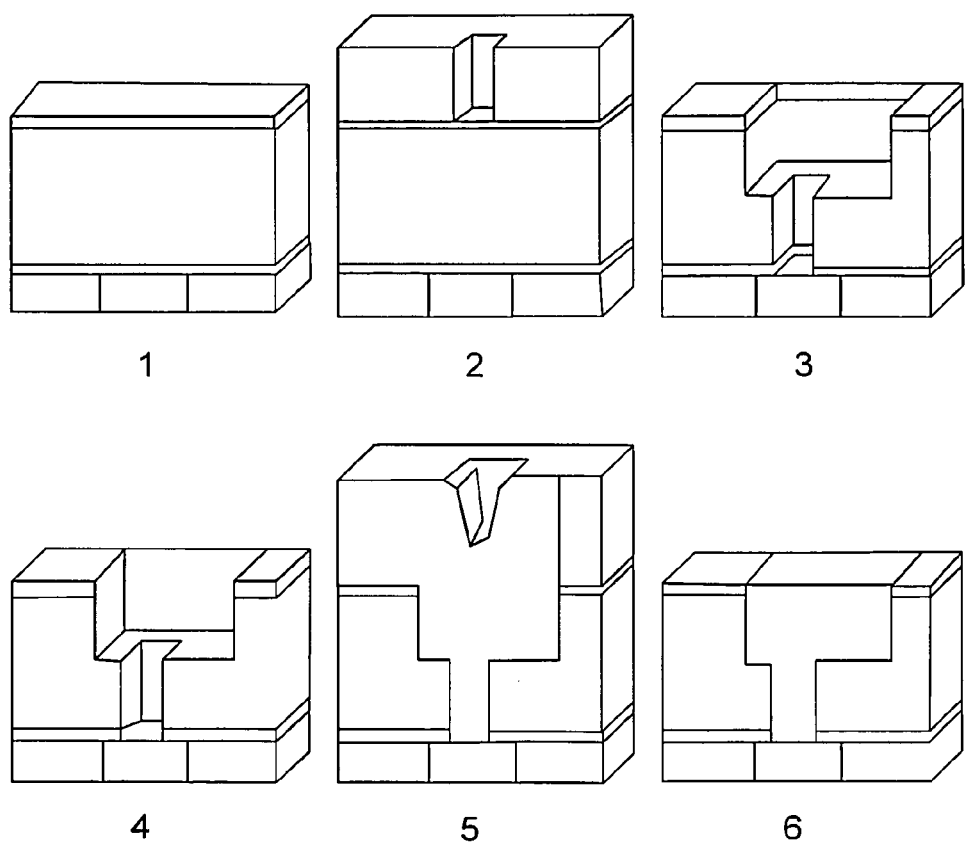
FIG. 7 illustrates a schematic diagram of a process for manufacturing of an embodiment of a dual damascene type copper interconnection structure.

Referring next to FIG. 7, a schematic diagram of a process for manufacturing of an embodiment of a dual damascene type copper interconnection structure is shown. The dual damascene technique comprises the following steps:
1) Forming an insulating layer
2) Forming a via/interconnection pattern
3) Etching of via/interconnection groove
4) Forming a barrier metal/seed copper layer
5) Burying copper (Cu) by electrolytic plating method
6) Chemical mechanical polishing (CMP) of Cu/barrier metal layer Please note that the pre-treatment process as well as the pre-annealing and the post-annealing steps are omitted for simplicity.

Figure 8:
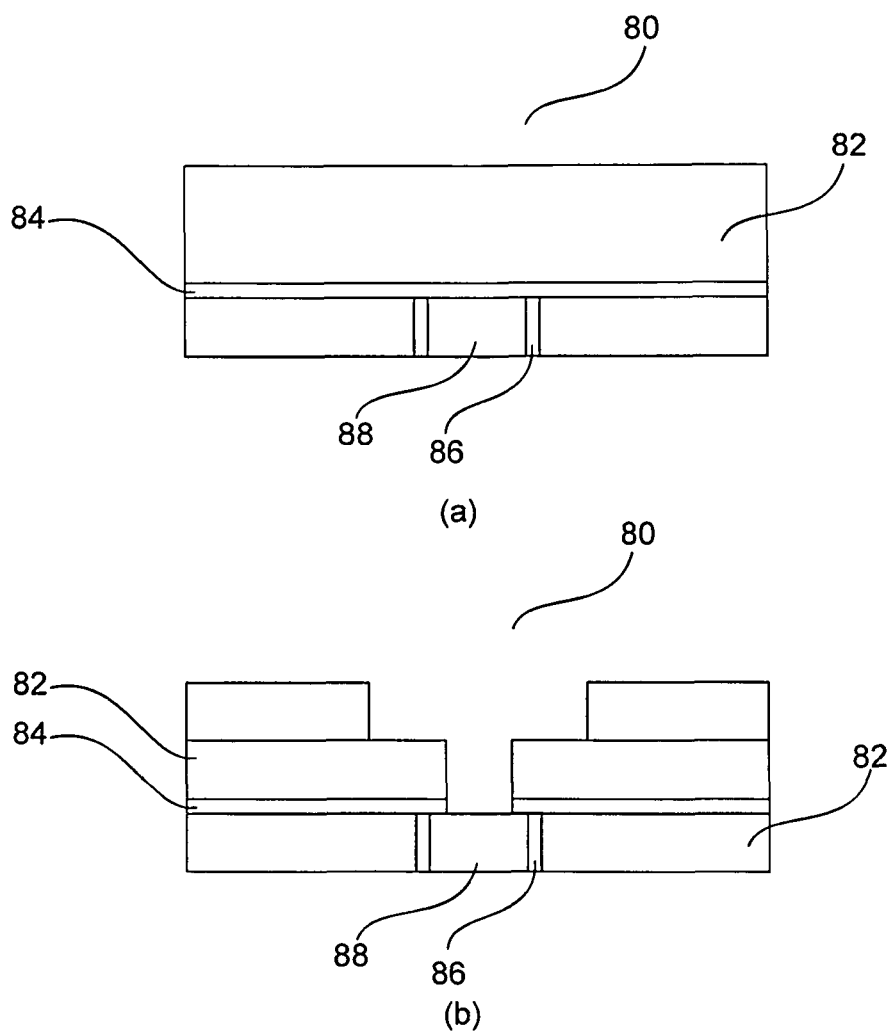
FIG. 8 depicts cross-sectional views of a CFx insulating layer with a multilayer structure.

The first half of the manufacturing process using the dual damascene technique is depicted in FIG. 8. A cross-sectional view of a CFx insulating layer with a multilayer structure 80 is shown in FIG. 8(*a*). As shown in this figure, the multilayer structure includes a fluorocarbon insulating layer 82, a cap layer 84, also called hard-mask or etch-stop layer, a barrier layer 86, and a copper (Cu) wiring layer 88. In this embodiment, the cap layer 84 may contain amorphous carbon or silicon carbide nitride (SiCN). Also, the barrier layer 86 is formed from titanium (Ti).

It should be noted that the copper (Cu) wiring layer 86 from the underlying multilayer structure is not exposed when forming the CFx insulating layer 82. However, when forming the barrier metal/seed copper layer, after etching the via/interconnection groove, the copper (Cu) wiring layer 86 is exposed to the atmosphere and is directly affected by the substrate temperature (please refer to FIG. 8(*b*)).

The mechanism used to reduce fluorine concentration in the high-temperature sputtering process is as follows: at the initial stage of the sputtering process, a metal fluoride solution, such as for example a titanium tetra-fluoride ($TiF_4$), is formed on the surface of the CFx insulating layer. By keeping the substrate temperature at the same desired level, the titanium tetra-fluoride ($TiF_4$) is evaporated due to its high level of vapor pressure. As a result, the fluorine concentration is decreased on the surface of the CFx insulating layer while the carbon concentration is increased such that a carbon-rich surface is formed on the surface of the CFx layer.

The carbon-rich surface generates, effectively, a plurality of metal-carbon bonds, such as for example Ti—C bonds, at the interface between the fluorocarbon (CFx) insulating layer and the titanium (Ti) barrier layer. Since the titanium (Ti) barrier layer is formed after forming the Ti—C bonds, the barrier layer is stabilized; thereby the adhesiveness between the CFx layer and the barrier layer is secured. Therefore, there is no need for a titanium-nitride (TiN) layer, with its high electric resistivity, interposed between the titanium (Ti) barrier layer and the CFx insulating layer to secure their adhesiveness. Thereby, the high-temperature sputtering process of the present invention provides a barrier layer with low electric resistivity and less loss compared to the conventional barrier layer forming process.

In the case where residual fluorine (F) is still present on the surface of the CFx insulating layer, the metal-carbon bonds are less likely to be formed as the metal-fluorine bonds have a lower covalent energy bond compared to the metal-carbon bonds. Therefore, the metal-fluorine bonds will be formed at the interface between the fluorocarbon (CFx) insulating layer and the barrier metal layer.

The barrier layer mainly composed of a metal element is formed using the sputtering device 100 with a predetermined setting condition. The barrier layer may be formed in the barrier layer sputtering chamber 106 at the substrate temperature of about 200° C. The treatment time may be set to 50 seconds for forming a titanium (Ti) barrier layer with a thickness of 18 nm. Argon (Ar) gas with a flow rate of about 70 sccm is also used inside of the barrier layer sputtering chamber 106 with an input power of about 300 W.

In this embodiment, the barrier layer mainly composed of the metal element is formed from titanium (Ti). This is mainly due to the facts that: first, titanium (Ti) is a material with high steam pressure when combined with fluorine atoms for forming titanium tetra-fluoride solution and second, titanium (Ti) has good barrier properties against copper (Cu). Other embodiments may use other metal elements for forming the barrier layer using the high-temperature sputtering process. Other metal elements having the same above-mentioned properties may include tantalum (Ta), ruthenium (Ru), manganese (Mn), or cobalt (Co).

Figure 9:
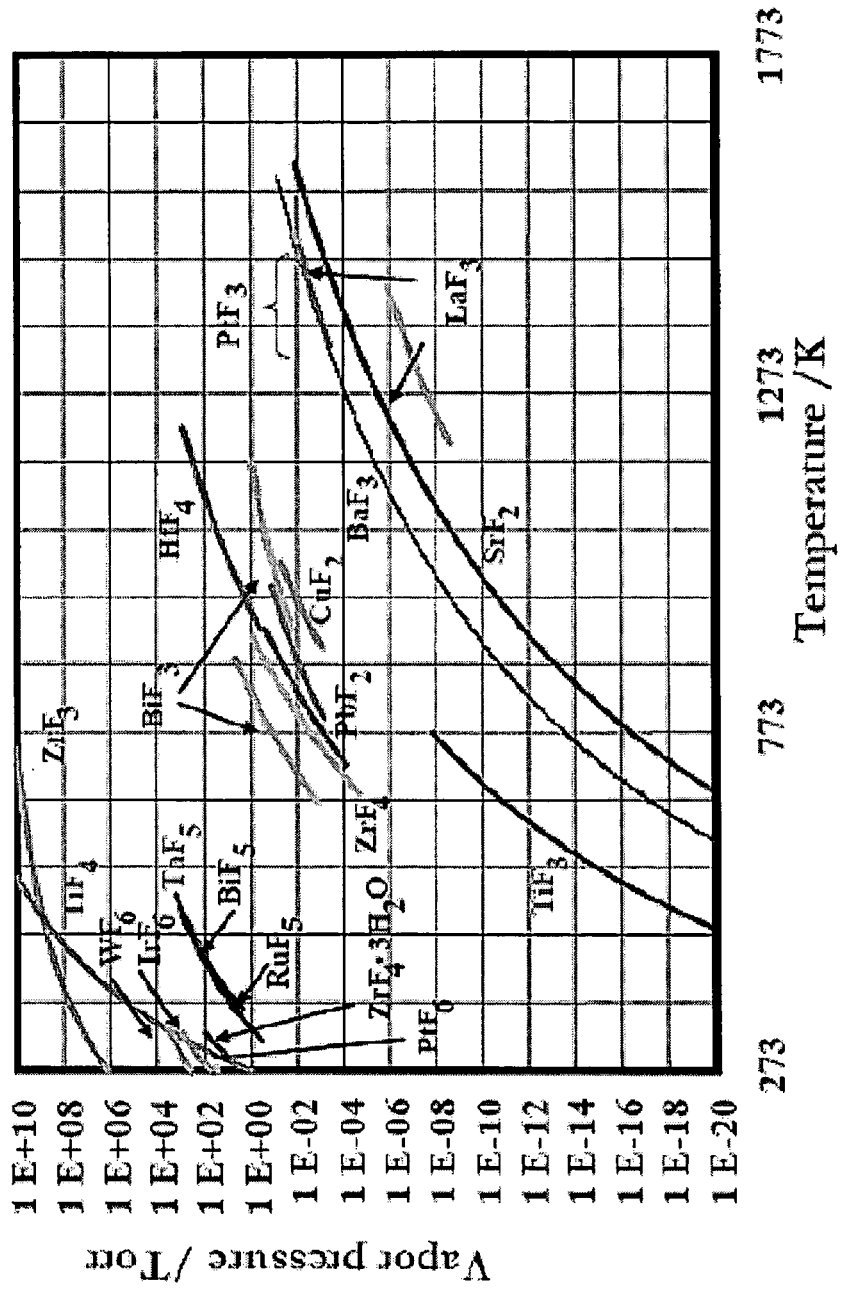
FIG. 9 illustrates steam pressure curve of fluoride as function of temperature.

FIG. 9 illustrates steam pressure curve of fluoride (F) as a function of temperature. As shown in this figure, tantalum (Ta) and ruthenium (Ru) both represent materials with high steam pressure. Please refer to fluoride of tantalum ($TaF_5$) and fluoride of ruthenium ($RuF_5$) curves in FIG. 9. On the other hand, tungsten (W) is a material with high steam pressure, $WF_6$ curve in FIG. 9, however it is not chosen as a candidate for the metal barrier layer of the present invention. This is because tungsten (W) does not have good barrier properties against copper (Cu).

In this embodiment, the barrier layer mainly composed of the metal element has a single layer structure. Therefore, the copper (Cu) interconnection body may be provided directly on top of the barrier layer, e.g., titanium (Ti). Other embodiments may form a barrier layer with multilayer structure. The barrier layer with multilayer structure may include a first layer mainly composed of a first metal element, such as for example titanium (Ti), and a second layer mainly composed of a metal element other than the first metal element. Examples of the metal element other than titanium (Ti) may include tantalum (Ta), ruthenium (Ru), Cobalt (Co), nickel (Ni), and manganese (Mn). In an alternative embodiment, the second layer of the multilayer structure may be formed from nitride of the first metal element, e.g., titanium nitride (TiN), or nitride of the metal element other than the first metal element such as, for example, tantalum nitride (TaN) and the like.

As will be discussed further below, the present invention provides an opportunity for forming the second layer of the multilayer structure on top of the first layer, e.g., titanium (Ti) layer, which is directly disposed underneath the copper interconnection body. In this way, by forming a barrier layer with multilayer structure the degrees of freedom for process selection is increased. This is due to the fact that an arbitrary layer may be formed on top of the titanium (Ti) barrier layer without the restriction of the conventional process, where the second layer is interposed between the Ti barrier layer and the CFx insulating layer due to their poor adhesion properties.

Figure 10:
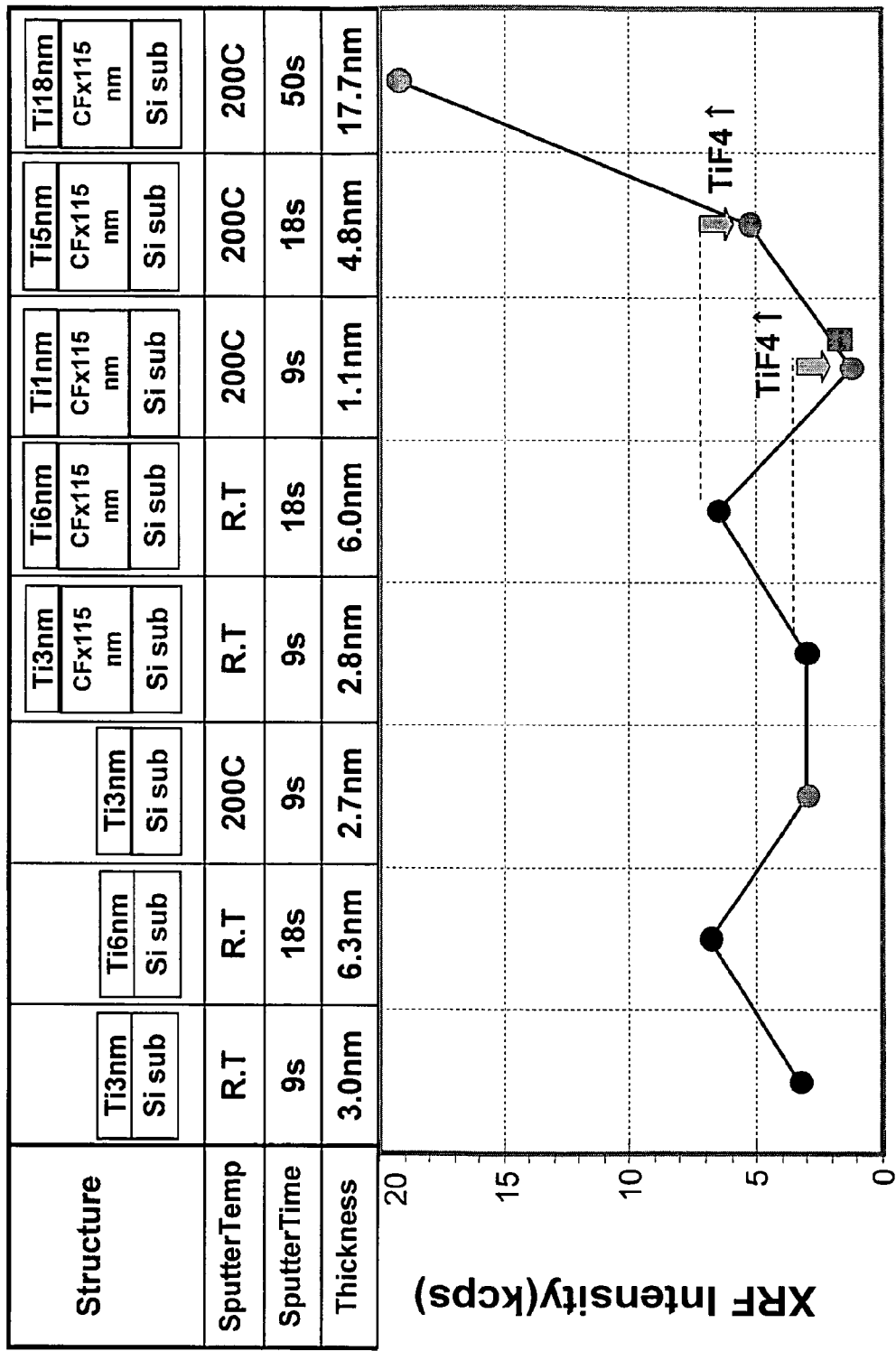
FIG. 10 illustrates target structure of various experimental samples and their XRF intensity used for measuring the thickness of barrier layers.

Referring next to FIG. 10, target structure of experimental samples used for measuring the thickness of titanium (Ti) barrier layer are shown at various sputtering temperature and sputtering time. X-ray fluorescence (XRF) analysis is used to measure the thickness of the barrier layer mainly composed of titanium (Ti). The XRF intensity curve illustrating the thickness of barrier layer for each experimental sample is also shown in FIG. 10. As shown in this figure, the longer the sputtering period, for experimental samples with the same structure formed at the same sputtering temperature, the thicker is the thickness of the titanium (Ti) barrier layer.

However, for experimental samples with the same structure formed at various sputtering temperature within the same sputtering period, two different trends were observed depending on the target structure. In the case where the titanium (Ti) barrier layer is formed directly on a silicon (Si) substrate, the thickness of the barrier layer does not vary as a function of sputtering temperature. The XRF analysis shows almost the same thickness value (3 nm and 2.7 nm) for the experimental samples #1 and #3 (please refer to the first and third column of the table in the XRF thickness row).

In the case where the titanium (Ti) barrier layer is formed on a fluorocarbon (CFx) barrier layer, the thickness of the barrier layer does vary as a function of sputtering temperature. For example, the XRF thickness for the experimental samples #4 and #6 are respectively 2.8 nm and 1.1 nm. It is determined that the 1.7 nm difference in the thickness value may be attributed to that fact that the titanium tetra-fluoride ($TiF_4$) solution is first formed and then evaporated during the high-temperature sputtering process. In this embodiment, the sputtering time is set to 9 seconds.

The XRF thickness for the experimental samples #5 and #7 are respectively measured at the following values: 6.0 nm and 4.8 nm. Likewise, the 1.2 nm difference in the thickness value may be attributed to the evaporation of the titanium tetra-fluoride ($TiF_4$) solution. In this embodiment, the sputtering time is set to 18 seconds. The XRF thickness for the experimental sample #8 is measured at about 17.7 nm. In this embodiment the sputtering temperature is set to the 200° C. while the sputtering time is set for a period of 50 seconds. It should be understood that the XRF analysis, in all of the above measurement, is performed after annealing the substrate at a temperature of about 350° C. for a period of 12 hours.

Figure 11:
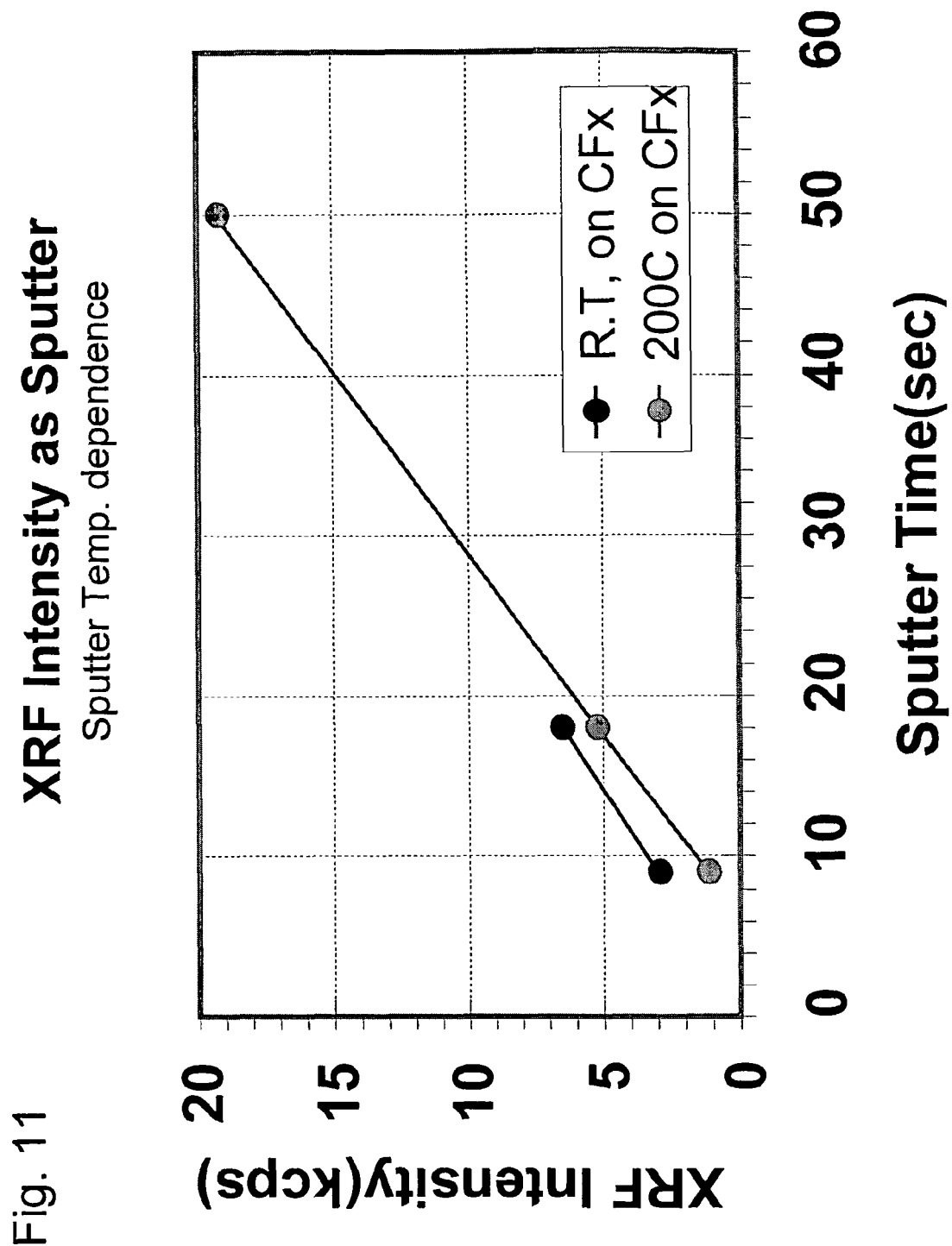
FIG. 11 illustrates the XRF intensity of experimental samples as a function of sputtering time.

According to these results, the thickness of titanium (Ti) barrier layer formed at a higher sputtering temperature such as, for example, 200° C. is less than the thickness of the titanium (Ti) barrier layer formed at room temperature by a value of about 1.2~1.7 nm. FIG. 11 illustrates the XRF intensity of the experimental samples #4 to #8 as a function of sputtering time for both sputtering temperatures: 200° C. and room temperature (R.T.)

Since titanium (Ti) is consumed to remove fluorine (F), at early stage, from the surface of the fluorocarbon (CFx) insulating layer, first by forming and then by evaporating the titanium tetra-fluoride ($TiF_4$) solution, the target value for the thickness of the barrier layer may be obtained by setting the thickness of the barrier layer to a value which is approximately higher about 1.2~1.7 nm compared to the thickness value of the barrier layer obtained by the conventional process.

(Post-Annealing the Substrate)

After forming the barrier layer using the high-temperature sputtering process, a post-annealing step is applied to the substrate using the same sputtering device 100. This heat treatment may be performed in the barrier layer deposition chamber 106 at a substrate temperature ranging from about 50° C. to about 200° C. The treatment time may be set to 180 seconds or less.

(Process of Forming the Copper (Cu) Seed Layer)

In what follows the fifth step of the process used for manufacturing of semiconductor devices according to the present invention will be explained. After forming the barrier layer mainly composed of metal element, a copper (Cu) seed layer is formed over the barrier layer using the same sputtering device 100. The copper (Cu) seed layer may be formed in the copper sputtering chamber 108, which is different from the barrier layer deposition chamber 106, at room temperature. In this embodiment, the copper (Cu) seed layer is formed by a physical vapor deposition (PVD) process. Any thickness of the copper seed layer is acceptable as long as there is sufficient space to bury copper interconnection within the via-holes or the interconnection grooves. The desired thickness of the copper (Cu) seed layer is about 5 nm.

(Process of Forming the Copper Interconnection)

In the last step of manufacturing process, after forming the copper (Cu) seed layer with a thickness of about 4-5 nm, the copper interconnection with a thickness of about 120-130 nm is formed using a conventional electrolytic plating process.

Experimental Samples:

In order to evaluate the barrier properties and also the adhesion of a barrier layer, formed by the high-temperature sputtering process, on a pre-treated fluorocarbon (CFx) insulating layer, several experimental samples are manufactured using the above-mentioned manufacturing process. For the purpose of evaluating the experimental samples, a copper layer with a thickness of about 150 nm is formed over the barrier layer, in the copper sputtering chamber 108, with the following setting condition: an argon (Ar) gas with a flow rate of 100 sccm, an input power of 500 W, and a processing time of 100 seconds. In the following, the results of these evaluations will be explained in detail.

(Experimental sample 10): This experimental sample is manufactured according to the process of the present invention to evaluate the barrier property and also the adhesion of the barrier layer to the CFx insulating layer. In this experimental sample, the argon annealing treatment is applied on to the surface of CFx insulating layer. This argon (Ar) annealing treatment is used as the pre-treatment process of step (2) in the semiconductor manufacturing process according to the process of the present invention.

Figure 12:
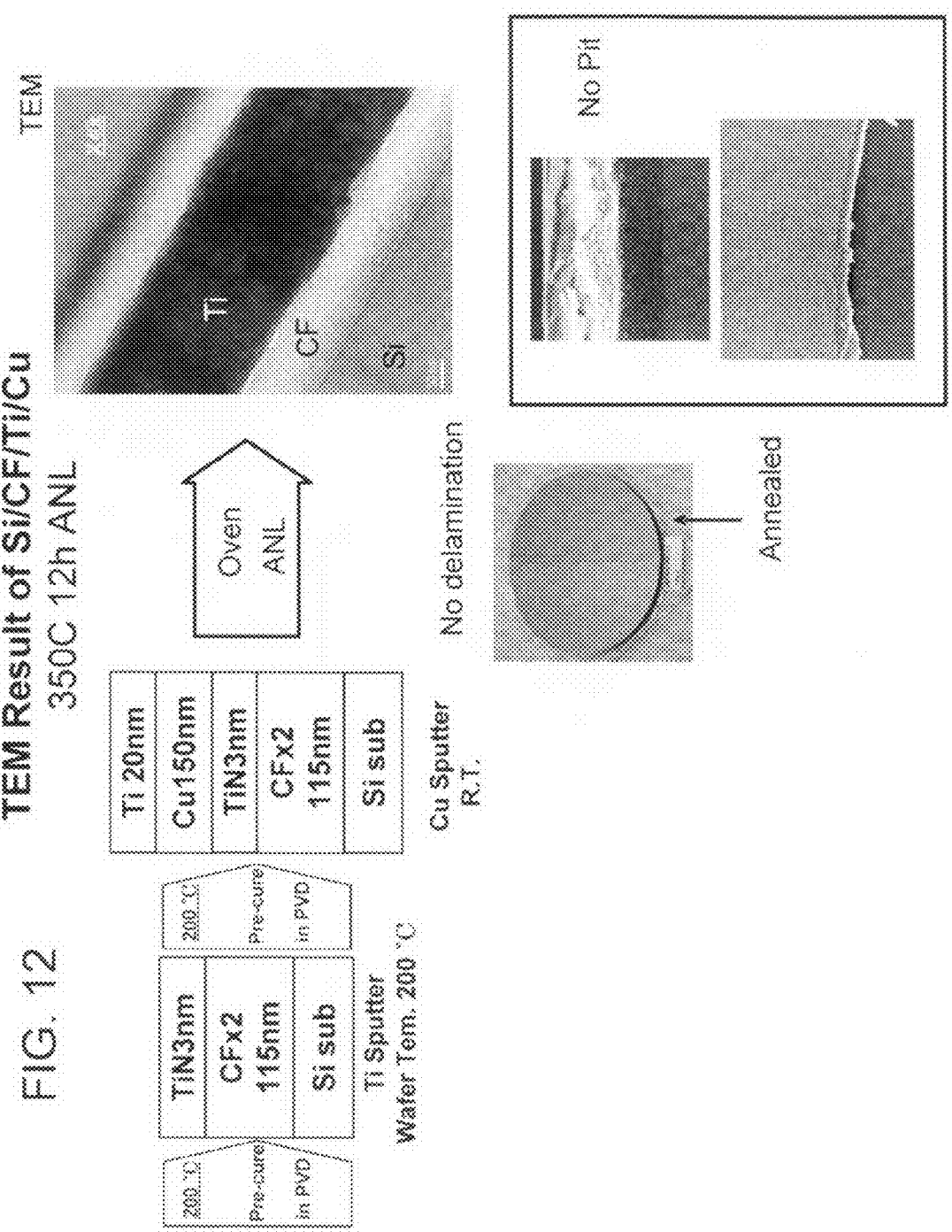
FIG. 12 illustrates a cross-sectional view and a surface view of an example of experimental sample and its process flow.

Referring next to FIG. 12, a schematic diagram of the process for manufacturing an experimental sample, after applying the argon annealing treatment is shown. A cross-section view and plan view of the experimental sample is also shown using a transmission electron microscopy (TEM) image. As shown in this figure, a pre-annealing treatment at a temperature of about 200° C. is applied on to the surface of the CFx insulating layer. Then, a titanium (Ti) barrier layer with a thickness of about 3 nm is formed using the high-temperature sputtering process. The titanium (Ti) barrier layer is formed in the barrier layer sputtering chamber 106, from the sputtering device 100, at a substrate temperature of about 200° C.

A post-annealing step is then applied on to the substrate including the titanium (Ti) barrier layer at 200° C. The pre-annealing and post-annealing steps are also performed in the barrier layer deposition chamber 106. In the last step, a copper (Cu) layer with a thickness of 150 nm is formed in the copper sputtering chamber 108 using a conventional sputtering process at room temperature. An additional titanium (Ti) layer with a thickness of 20 nm is formed over the copper layer to prevent copper from oxidation. The experimental sample is then evaluated after performing a pre-evaluation annealing at a temperature of about 350° C. for a period of 12 hours. This pre-evaluation annealing is performed in the annealing chamber 104 from the sputtering device.

As shown in FIG. 12, a tape test is conducted to evaluate the adhesion of titanium barrier layer to the CFx insulating layer. As a result, no delamination or peeling of the barrier layer is observed in this sample. Further, the cross-sectional view and the plan view of this experimental sample are very favorable with regards to the barrier properties of the titanium (Ti) layer. As shown in the enlarged portion of the cross-sectional view, no bright grains are present at the interface of the CFx layer and the silicon (Si) substrate. Thereby, no penetration of copper from the interconnection body has occurred into the fluorocarbon (CFx) insulating layer.

This has also been confirmed by the plan view of the experimental sample where no dents and raises are observed on the surface of the experimental sample. This experimental sample shows excellent barrier properties and strong adhesion bond between the titanium (Ti) barrier layer and the CFx insulating layer. This is contrary to prior results obtained from experimental samples where only a pre-treatment process is applied on to the surface of the fluorocarbon (CFx) insulating layer with a barrier layer formed from a conventional sputtering process at room temperature. Please refer back to FIGS. 5-6, in particular, to experimental sample #5.

Figure 13:
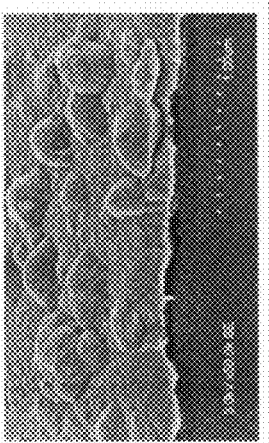
FIG. 13 illustrates a cross-sectional view and surface view of an example of alternative experimental sample with its process flow, the blister test result, and the tape test result.

(Experimental samples 11-12): In what follows, the barrier properties of experimental samples are evaluated where the titanium (Ti) barrier layer is formed with a high thickness value around 18 nm. FIG. 13 illustrates the target structure and the process flow used for manufacturing the experimental sample 11. As shown in this figure, a hydrogen ($H_2$) annealing treatment is applied on to the surface of the CFx insulating layer for reducing fluorine concentration on the surface of the CFx insulating layer. Then, a per-annealing treatment with hydrogen ($H_2$) atmosphere is conducted for a period of 180 seconds.

After the pre-annealing step, the titanium (Ti) barrier layer is formed at the substrate temperature of about 200° C., using the high-temperature sputtering process. The sputtering time for the high-temperature sputtering process is set to 50 seconds which leads to form the titanium barrier layer with a thickness of 18 nm. A post-annealing treatment, hydrogen ($H_2$) at 200° C. for a period of 180 seconds, is applied to the substrate, followed by a copper (Cu) layer forming step where the copper (Cu) layer is formed with a thickness of 150 nm at room temperature. This experimental sample (#11) is then subjected to the blister test and tape test.

A plan view of the structure, after adhering scotch tapes to its surface, is also shown in FIG. 13. After evaluating the whole wafer, it was determined that no discoloration was observed around the attached tapes. In addition, this experimental sample passed both the blister test and tape test. Furthermore, FIG. 13 illustrates a cross-sectional view and a top surface view of the experimental sample 11. As shown, no copper (Cu) diffusion is observed as a result of the high thickness value for the titanium (Ti) barrier layer.

Figure 14:
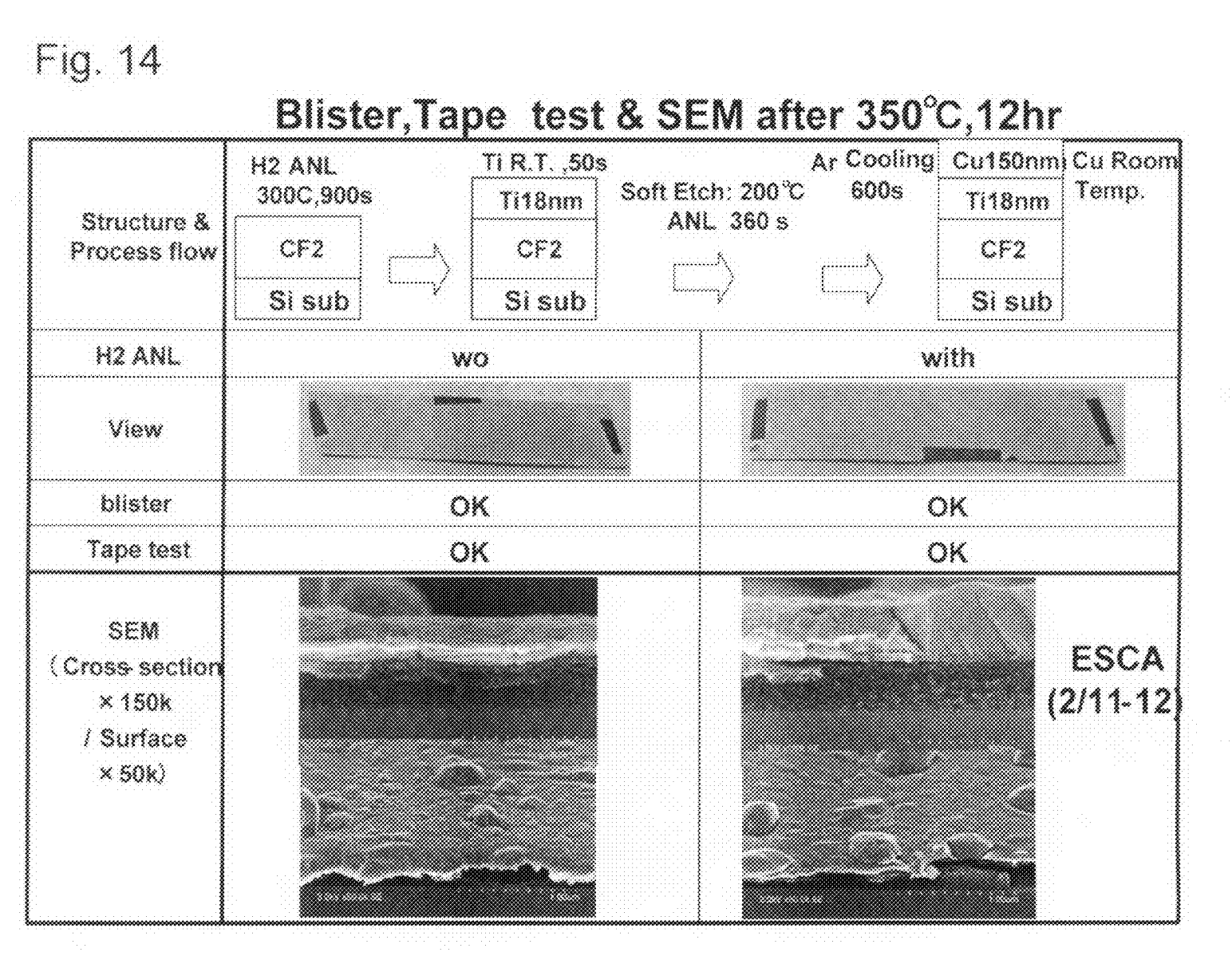

The target structure and the process flow used for manufacturing the experimental sample 12 are shown in FIG. 14. Two experimental samples are formed using the process flow shown in FIG. 14: in the first sample hydrogen ($H_2$) annealing treatment is applied on to the surface of the CFx insulating layer for reducing fluorine concentration but in the second sample no hydrogen ($H_2$) annealing is applied to the CFx insulating layer. In addition, no pre-annealing step is conducted on both of these experimental samples. After forming the titanium (Ti) barrier layer with a thickness of 18 nm at the substrate temperature of about 200° C., a soft etch treatment and an argon cooling treatment are respectively applied on to the substrate.

The soft etch treatment is a process to remove an oxide film on the titanium (Ti) barrier layer surface by applying 400 kHz of RF to the substrate so as to attract argon (Ar) ions. The soft etch process is performed in an argon atmosphere at a temperature of 200° C. for a period of 360 seconds. Since this process is performed at a temperature of 200 degree, it may be considered as a post-annealing and oxide film removal treatment. Further, the argon (Ar) cooling treatment is a process to cool down the substrate by placing the substrate for 600 seconds on a cooling plate which is maintained at 20° C. to 30° C.

The argon (Ar) cooling treatment is performed in order to deposit the copper (Cu) layer at room temperature. Please note that this process is not performed in the experimental examples that do not specifically indicate. In the last step, the copper (Cu) layer with a thickness of 150 nm is formed on to the titanium (Ti) barrier layer at room temperature. Both of these experimental samples are subjected to the blister test and tape test. A plan view of both structures, after adhering scotch tapes to their surface, is also shown in FIG. 14. Some discolorations of the copper (Cu) surface, around the attached tapes, were observed for the first experimental sample with hydrogen ($H_2$) annealing treatment. As shown in FIG. 14, both experimental samples 12 passed the blister test and the tape test, Similar to the case of experimental sample #11.

FIG. 14 also illustrates a cross-sectional view and a top surface view of both experimental samples. Similar to the previous case (sample #11), no copper (Cu) diffusion is observed due to the thickness of the titanium (Ti) barrier layer. The blister test, the tape test and the SEM image are taken after annealing the substrate at 350° C. for a period of 12 hours. The experimental samples 11-12 were manufactured to confirm the barrier properties of the titanium barrier layer in the case where their thickness value is high, e.g. 18 nm. However, the thickness of metal barrier layer is required to be thin to prevent shortening of the interconnection width. For example, for forming a desired copper interconnection through a via hole with a width of 20 nm, it is required that the barrier layer be formed with a thickness of about 3 nm. In this way, the desired copper (Cu) interconnection with 14 nm width is provided.

(Experimental samples 13-15): FIG. 15 illustrates the target structure and the process flow used for manufacturing of the experimental samples 13-15. As shown in this figure, a hydrogen ($H_2$) annealing treatment is applied on to the surface of the CFx insulating layer for reducing fluorine concentration on the surface of the CFx insulating layer in all three experimental samples. This hydrogen ($H_2$) annealing treatment is applied at a temperature of about 300° C. for a time period of 900 seconds. Then, a per-annealing treatment is conducted, in hydrogen ($H_2$) atmosphere, with a temperature of about 200° C. for a period of 180 seconds.

After the pre-annealing step, the titanium (Ti) barrier layer is formed at the substrate temperature of about 200° C. using the high-temperature sputtering process. The sputtering time for experimental samples 13-15 is set respectively to 9, 17, and 25 seconds. The above-mentioned sputtering times form respectively the titanium barrier layers with a thickness of 1 nm, 4 nm, and 7 nm. A post-annealing treatment, hydrogen ($H_2$) annealing at 200° C. for a period of 180 seconds, is applied to the substrate, followed by a copper (Cu) layer forming step where the copper (Cu) layer is formed with a thickness of 150 nm at room temperature.

The experimental samples 13-15 are then subjected to the blister test and tape test after annealing the substrate at a temperature of about 350° C. for a period of 12 hours. A plan view of three structures, after adhering scotch tapes to their surface, is also shown in FIG. 15. As shown in this figure, only the experimental sample #15 with 7 nm thickness of the titanium (Ti) barrier layer passed both the blister test and the tape test. As for the other two samples, the experimental sample #14 with 4 nm thickness of the titanium (Ti) barrier layer passed only the blister test, while the experimental sample #13 with 1 nm thickness of the titanium (Ti) barrier layer passed only the tape test.

With reference to FIG. 16, a cross-sectional view and a top surface view of the experimental samples 13-15 are shown using SEM image. The SEM image is taken after annealing the substrate at a temperature of about 350° C. for a period of 12 hours. As shown in this figure, bright grains are present at the interface of the CFx insulating layer and the silicon (Si) substrate in all three samples (#13-#15). However, the experimental sample with higher thickness of the barrier layer shows fewer copper (Cu) penetrations. Also less dents were observed on the surface of the copper surface in the case of experimental sample #15 with higher barrier layer thickness (7 nm).

In the following, the properties of the fluorocarbon (CFx) insulating layer with regards to the barrier properties and the adhesion to the barrier layer is investigated. For this purpose three set of experimental samples were manufactured. In each set, two experimental samples with different fluorocarbon (CFx and CFx2) insulating layer are formed. Both CFx and CFx2 insulating layers were formed using the radial line slot antenna device with two different setting conditions. Table I summarizes both setting conditions for each CFx and CFx2 layers:

TABLE I

| Setting conditions used for forming CFx and CFx2 insulating layers | | |
|---|---|---|
| | CFx | CFx2 |
| Microwave Power (W) | 3000 | 1500 |
| Pressure (mTorr) | 56 | 28 |
| C5F8 flow rate (sccm) | 250 | 130 |
| Argon (Ar) flow rate (sccm) | 200 | 120 |

The CFx2 layer is a fluorocarbon (CF) insulating layer formed in a condition where the amount of degassing is lower compared to the case of CFx layer. As shown in Table I, the setting conditions used for forming CFx2 layer, such as for example the microwave power, the pressure, and the gas flow rates, are about half of those used for forming the conventional CFx layer. However, the processing time for forming the CFx2 layer is about three times longer compared to the case of CFx layer (40 sec→120 sec). Similar to the case of CFx layer, the wafer state temperature is set to be about 350° C. when forming the CFx2 insulating layer. Therefore, same actions may be achieved with regards to defluorination treatment during this extended time period. The direction of development for the current CFx layer is close to the one used for CFx2 development.

With reference to FIG. 17, the target structure and the flow process used for manufacturing each set of experimental samples are shown. Hydrogen ($H_2$) annealing, pre-annealing and post-annealing treatments are used in each set of experimental samples. The hydrogen annealing for reducing fluorine concentration is performed at a temperature of 200° C. for a period of 900 seconds. The titanium (Ti) barrier layer is formed using the high-temperature sputtering process at the substrate temperature of 200° C. The processing time for the post-annealing treatment, in the first set of experimental sample, is set to 360 seconds, while this processing time is 180 seconds for the second and third set of experimental samples. No other post-treatment is applied on to the substrate in the case of the first set of experimental sample, however, oxygen ($O_2$) annealing for a period of 300 seconds and argon (Ar) annealing for a period of 600 seconds are applied, respectively, on to the substrate of the second and third experimental samples.

The experimental samples in each set are then subjected to the blister test and tape test after annealing the substrate at a temperature of about 350° C. for a period of 12 hours. A plan view of experimental samples for each set, after adhering scotch tapes to their surface, is also shown in FIG. 17. All the samples with CFx2 insulating layer passed the blister test and tape test. This shows that CFx2 insulating layers have higher resistance for barrier layer peeling compared to the CFx insulating layer.

Figure 18:
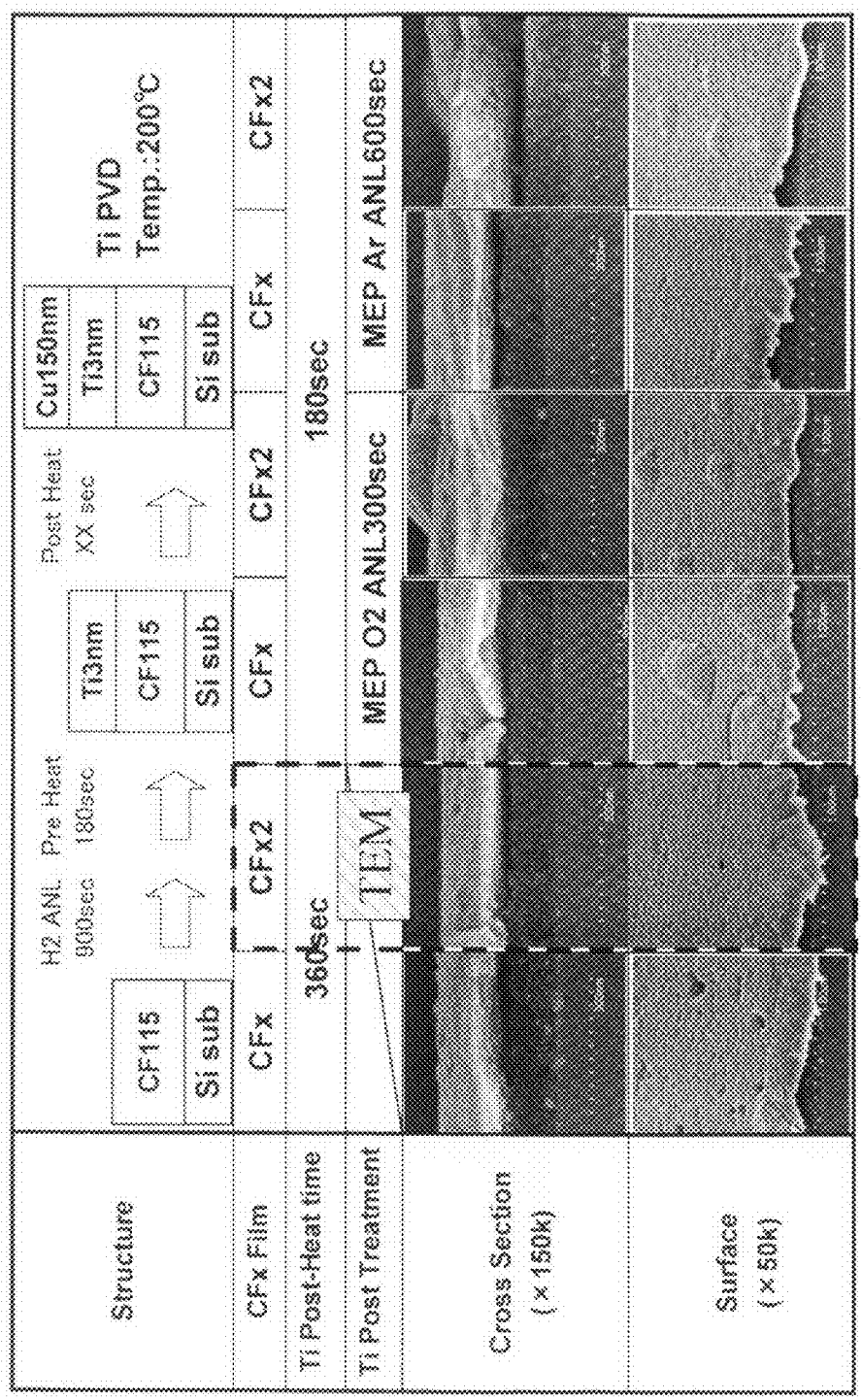
FIG. 18 illustrates cross-sectional views and surface views of experimental samples shown in FIG. 17.

Referring next to FIG. 18, a cross-sectional view and a top surface view of the experimental samples for each set are shown using SEM image. The SEM image is taken after annealing the substrate at a temperature of about 350° C. for a period of 12 hours. As shown in this figure, bright grains are less present at the interface of the CFx2 insulating layer and the silicon (Si) substrate in comparison with the interface of the CFx insulating layer and the silicon (Si) substrate. Further, the experimental samples with CFx2 insulating layer have less dents on their copper (Cu) surface.

In what follows the effect of each manufacturing step, such as for example the pre-annealing step, the post-annealing step and the barrier layer forming step as a function of temperature, on the barrier properties and the adhesiveness between the barrier layer and the CFx insulating layer will be discussed in detail. For this purpose, various experimental samples with a titanium-nitride (TiN) barrier layer formed at different substrate temperature and process steps are evaluated.

Figure 19:
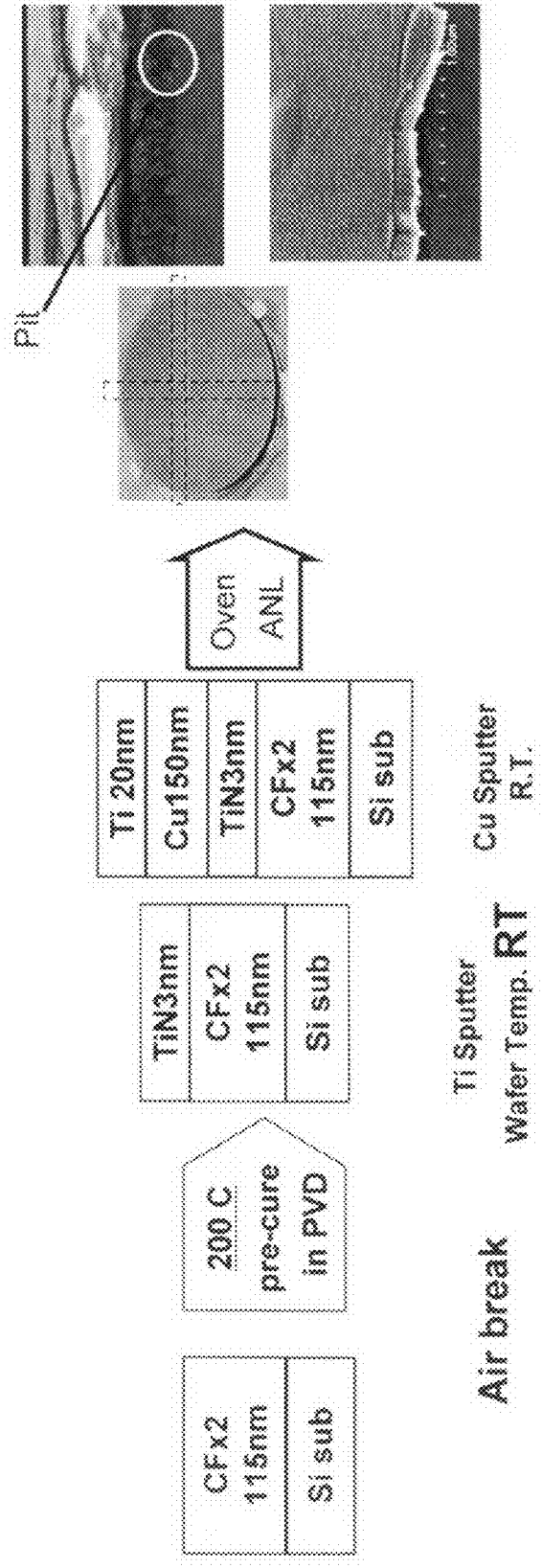
FIG. 19 illustrates a cross-sectional view and a surface view of an embodiment of experimental sample and its process flow.

FIG. 19 illustrates the target structure and process flow used to manufacture an experimental sample. The process used to manufacture the experimental sample is as follows: 1) forming the CFx2 insulating layer on a silicon (Si) substrate, 2) pre-annealing treatment at a temperature of about 200° C., 3) forming a titanium-nitride (TiN) layer using the conventional sputtering method at room temperature, 4) forming the copper (Cu) layer using the conventional sputtering method at room temperature, and 5) forming a titanium cap layer to prevent copper (Cu) oxidation.

Please note that the titanium-nitride (TiN) barrier layer is low in barrier property, compared to the titanium (Ti) barrier layer, as it contains a relatively lower amount of titanium due to the existence of the nitrogen (N) atoms. As it will be discussed further below, the addition of a post-annealing step, after forming the barrier layer, e.g., titanium-nitride (TiN) layer, helps to reduce further fluorine (F) concentration on the CFx insulating layer (including the vicinity of the surface of the CFx insulating layer), which in turns improves the barrier property of the titanium-nitride (TiN) layer.

After performing a pre-evaluation annealing at a temperature of about 350° C. for a period of 12 hours, the experimental sample is subjected to the tape test and SEM analysis. A plan view of the experimental sample after applying adhesive scotch tape, as well as, a cross-sectional view and top surface view on the experimental sample are also shown in FIG. 19. According to these results, no peeling of the barrier layer is observed in this sample. However, copper (Cu) penetration is shown at the interface between the CFx2 insulating layer and silicon (Si) substrate. It is believed that the absence of peeling of the barrier layer is directly related to the fact that many copper (Cu) penetrations has occurred in this experimental sample.

In the next step, two experimental samples are formed with separate manufacturing process. The process used to manufacture the first experimental sample is as follows: 1) forming the CFx2 insulating layer on a silicon (Si) substrate, 2) forming a titanium-nitride (TiN) layer using the high-temperature sputtering process at a substrate temperature of about 100° C., 3) forming the copper (Cu) layer using the conventional sputtering method at room temperature, and 4) forming a titanium cap layer.

The process used to manufacture the second experimental sample is as follows: 1) forming the CFx2 insulating layer on a silicon (Si) substrate, 2) 2) pre-annealing treatment at a temperature of about 200° C., 3) forming a titanium-nitride (TiN) layer using the high-temperature sputtering process at a substrate temperature of about 200° C., 4) forming the copper (Cu) layer using the conventional sputtering method at room temperature, and 5) forming a titanium cap layer to prevent copper (Cu) oxidation. This process is different from the process of the first experimental sample in that the pre-annealing step is performed before forming the barrier layer and the barrier layer is formed at a higher temperature (200° C.). In both of the above experimental samples, no post-annealing treatment is performed after forming the titanium-nitride (TiN) barrier layer.

Figure 20:
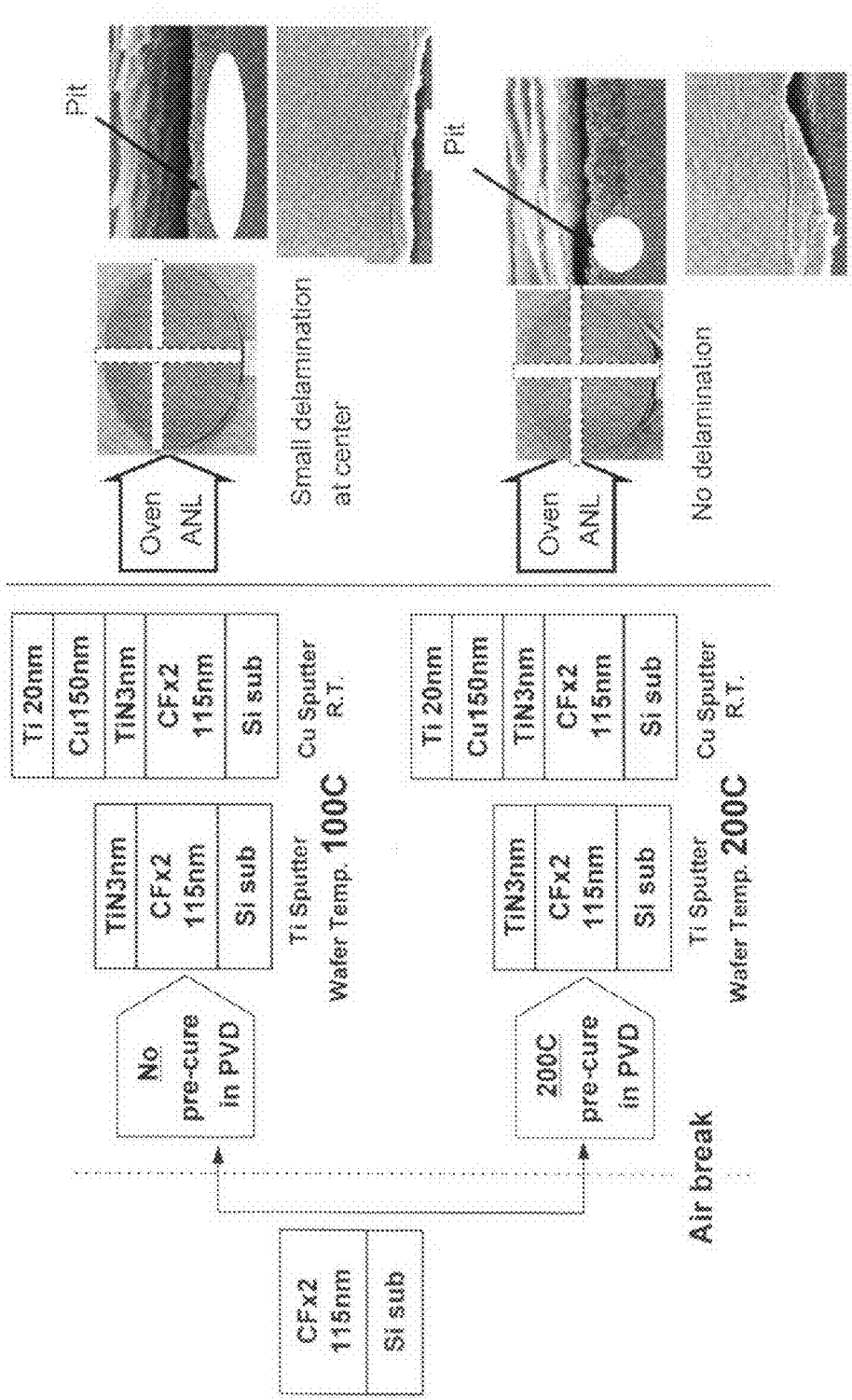
FIG. 20 illustrates a cross-sectional view and a surface view of another embodiment of experimental samples and its process flow.

The target structure and process used for manufacturing both experimental samples are shown in FIG. 20. A pre-evaluation annealing is performed at a temperature of about 350° C. for a period of 12 hours. Then, both experimental samples are subjected to tape test and SEM analysis. A plan view of the experimental samples after applying adhesive scotch tape, as well as, a cross-sectional view and top surface view of both experimental samples are also shown in FIG. 20. It is determined that the first experimental sample, with its barrier layer formed at 100° C., shows both the barrier layer peeling and the copper penetration. No peeling was observed for the second experimental sample with the higher barrier layer forming temperature (200° C.). However, small copper (Cu) penetration is shown at the interface between the CFx2 insulating layer and silicon (Si) substrate.

With reference to FIG. 21, the target structure and process flow used to manufacture another experimental sample is shown. The process used to manufacture this experimental sample is as follows: 1) forming the CFx2 insulating layer on a silicon (Si) substrate, 2) pre-annealing treatment at a temperature of about 200° C., 3) forming a titanium-nitride (TiN) layer using the high-temperature sputtering process at a substrate temperature of about 200° C., 4) post-annealing treatment at a temperature of about 200° C., 5) forming the copper (Cu) layer using the conventional sputtering method at room temperature, and 6) forming a titanium cap layer to prevent copper (Cu) oxidation. For the sake of convenience, the target structure and the process used to manufacture the second experimental sample are also shown in this figure. This process is different from the process of the second experimental sample in that a post-annealing step is performed after forming the barrier layer with the high-temperature sputtering process.

Similar to the previous cases, a pre-evaluation annealing at a temperature of about 350° C. for a period of 12 hours is performed. The experimental sample is then subjected to the tape test and SEM analysis. A plan view of the experimental sample after applying adhesive scotch tape, as well as, a cross-sectional view and top surface view on the experimental sample are also shown in FIG. 21. For the sake of convenience, the results from the second experimental sample are also shown in this figure.

As shown in FIG. 21, the experimental sample with the additional post-annealing step shows no copper (Cu) penetration at the interface between the CFx2 insulating layer and silicon (Si) substrate. This is mainly due to the fact that the post-annealing step reduces, even further, fluorine (F) concentration in the CFx insulating layer. In this way, the barrier property of the titanium-nitride (TiN) layer is improved such that no copper penetration is observed at the interface of the silicon (Si) substrate and the CFx2 insulating layer. In addition no peeling of the barrier layer is also observed in this sample.

In conclusion, the substrate temperature of the present invention is adjusted and maintained to a temperature of about 200° C. during the entire manufacturing process, which means during: the CFx forming process, the pre-treatment surface process, the pre-annealing process, the barrier layer forming process, and the post-annealing process. In other words, the fluorine reduction of the CFx insulating layer is performed throughout the entire manufacturing process.

While the principles of the disclosure have been described above in connection with specific apparatuses and methods, it is to be clearly understood that this description is made only by way of example and not as limitation on the scope of the invention.

The invention claimed is:

1. A method for manufacturing a semiconductor device, the method comprising steps of:
    annealing an insulating layer, wherein the insulating layer comprises fluorocarbon ($CF_x$) film; and
    forming a barrier layer including a metal element over the insulating layer, wherein the barrier layer is formed by a high-temperature sputtering process after the step of annealing,
    wherein a substrate temperature is maintained at between about 70° C. and 200° C. during the high-temperature sputtering process, such that copper of an underlying conductive layer is suppressed from being aggregated while moisture on a surface of the insulating layer is evaporated in vacuum.

2. The method as recited in claim 1, wherein step the step of annealing is performed under a predetermined condition while exposing a surface of the insulating layer to an inert gas.

3. The method as recited in claim 2, wherein the step of annealing further comprises a step of removing moisture from the surface of the insulating layer so as to eliminate fluorine concentration with weak bonds.

4. The method as recited in claim 2, wherein the predetermined condition includes a temperature ranging from 180° C. to 220° C., which is applied for a time period ranging from 3 to 5 minutes.

5. The method as recited in claim 1, wherein the annealing step is performed under a predetermined condition while exposing a surface of the insulating layer to a reactive gas that comprises hydrogen ($H_2$) gas.

6. The method as recited in claim 5, wherein the annealing step has an effect of reducing fluorine concentration on the surface of the insulating layer while increasing carbon concentration thereupon.

7. The method as recited in claim 5, wherein the fluorine concentration is reduced by forming hydrogen fluoride (HF) which is detached from the surface of the insulating layer.

8. The method as recited in claim 5, wherein the predetermined condition includes a temperature of at least 100° C. applied for a time period not less than 5 minutes.

9. The method as recited in claim 1, wherein the high-temperature sputtering process comprises a step of:
    removing fluorine from a surface of the insulating layer while forming a carbon-rich surface thereupon.

10. The method as recited in claim 9, wherein the step of removing further comprises steps of:
    forming a metal fluoride solution on the surface of the insulating layer, and
    evaporating the metal fluoride solution from the surface of the insulating layer.

11. The method as recited in claim 1, wherein the metal element comprises titanium (Ti), tantalum (Ta), ruthenium (Ru), manganese (Mn), or cobalt (Co).

12. The method as recited in claim 11, wherein the barrier layer is formed in an argon (Ar) atmosphere with a flow rate of about 70 sccm, at the substrate temperature of about 200°, at a power level of about 300 W, and a treatment time of about 50 seconds.

13. The method as recited in claim 1, wherein the barrier layer has a multilayer structure.

14. The method as recited in claim 1 further comprises a step of performing a post-annealing treatment after the step of forming the barrier layer, wherein the post-annealing treatment is performed at a temperature ranging from about 50° C. to 200° C. for a time period of not more than 180 seconds.

15. The method as recited in claim 1, wherein the insulating layer is formed using a radial line slot antenna microwave plasma treatment device with a predetermined setting condition.

16. The method as recited in claim 15, wherein the predetermined setting condition includes a pressure ranging from 25 mTorr to 30 mTorr with a microwave power ranging from 1500 W to 2000 W.

17. A method for manufacturing a semiconductor device, the method comprising steps of:
    conducting a pre-treatment process on an insulating layer so as to form a carbon-rich surface having a compositional ratio of carbon to fluorine (C/F) more than 1, wherein the insulating layer comprises fluorocarbon with an arbitrary compositional ratio of carbon to fluorine ($CF_x$) before conducting the pre-treatment process; and
    forming a barrier layer including a metal element over the insulating layer, wherein the barrier layer is formed by a high-temperature sputtering process after the step of conducting the pre-treatment process,
    wherein a substrate temperature is maintained at between about 70° C. and 200° C. during the high-temperature sputtering process, such that copper of an underlying conductive layer is suppressed from being aggregated while moisture on a surface of the insulating layer is evaporated in vacuum.

18. The method as recited in claim 17, wherein the step of conducting the pre-treatment process comprises a step of annealing the insulating layer under a predetermined condition while exposing a surface of the insulating layer to an inert gas atmosphere.

19. The method as recited in claim 18, wherein the step of annealing comprises a step of:
    removing moisture from the surface of the insulating layer so as to eliminate fluorine concentration with weak bonds.

20. The method as recited in claim 18, wherein the predetermined condition includes a temperature ranging from 180° C. to 220° C., which is applied for a time period ranging from 3 to 5 minutes.

21. The method as recited in claim 17, wherein the step of conducting the pre-treatment process comprises a step of annealing the insulating layer under a predetermined condition while exposing the surface of the insulating layer to a reactive gas atmosphere that comprises hydrogen ($H_2$) gas.

22. The method as recited in claim 21, wherein the annealing step has an effect of reducing fluorine concentration on the surface of the insulating layer while increasing carbon concentration thereupon.

23. The method as recited in claim 21, wherein the fluorine concentration is reduced by forming hydrogen fluoride (HF) which is detached from the surface of the insulating layer.

24. The method as recited in claim 21, wherein the predetermined condition includes a temperature of at least 100° C. applied for a time period not less than 5 minutes.

25. The method as recited in claim 17, wherein the step of conducting the pre-treatment process comprises a step of applying a plasma treatment to the insulating layer by exposing a surface of the insulating layer to a plasma, which is generated by exciting a gas including hydrogen atoms or carbon atoms under a predetermined condition.

26. The method as recited in claim 25, wherein the plasma treatment step has an effect of reducing fluorine concentration on the surface of the insulating layer while increasing carbon concentration thereupon.

27. The method as recited in claim 25, wherein the gas including hydrogen atoms comprises hydrogen gas ($H_2$), methane gas ($CH_4$), or silane gas ($SiH_4$), and wherein the fluorine concentration is reduced by forming hydrogen fluoride (HF) which is desorbed from the surface of the insulating layer.

28. The method as recited in claim 25, wherein the gas including carbon atoms comprises carbon monoxide gas (CO) or methane gas ($CH_4$), and wherein the fluorine concentration is reduced by forming a C-F bond which desorbs fluorine (F) from the surface of the insulating layer.

29. The method as recited in claim 25, wherein the plasma is generated using a radial line slot antenna microwave plasma treatment device.

30. The method as recited in claim 25, wherein the step of conducting the pre-treatment process comprises steps of:
dipping the insulating layer into a solution comprising hydroxide of a metal element;
washing the insulating layer with pure water after the dipping step; and
drying the insulating layer after the washing step.

31. The method as recited in claim 30, wherein the metal element is selected from the group consisting of calcium (Ca), strontium (Sr), barium (Ba), sodium (Na), potassium (K), and magnesium (Mg).

32. A method for manufacturing a semiconductor device, the method comprising steps of:
annealing an insulating layer under a predetermined condition while exposing a surface of the insulating layer to an inert gas atmosphere; and
performing a high-temperature sputtering process after the step of annealing so as to form a barrier layer including a metal element such that metal-C bonds are formed at an interface between the insulating layer and the barrier layer,
wherein a substrate temperature is maintained at between about 70° C. and 200° C. during the high-temperature sputtering process, such that copper of an underlying conductive layer is suppressed from being aggregated while moisture on a surface of the insulating layer is evaporated in vacuum, and
wherein the annealing step the step of annealing further comprises a step of removing moisture from the surface of the insulating layer, and
the insulating layer comprises fluorocarbon ($CF_x$) film.

33. The method as recited in claim 32, wherein the predetermined condition includes a temperature ranging from 180° C. to 220° C., which is applied for a time period ranging from 3 to 5 minutes.

34. The method as recited in claim 32, wherein the barrier layer is formed in an argon (Ar) atmosphere with a flow rate of about 70 sccm, at the substrate temperature of about 200°, at a power level of about 300 W, and a treatment time of about 50 seconds.

35. The method as recited in claim 32, wherein the metal element comprises titanium (Ti), tantalum (Ta), ruthenium (Ru), manganese (Mn), or cobalt (Co).

36. The method as recited in claim 32, wherein the high-temperature sputtering process comprises a step of:
removing fluorine from a surface of the insulating layer while forming a carbon-rich surface thereupon.

37. The method as recited in claim 36, wherein the step of removing further comprises steps of:
forming a metal fluoride solution on the surface of the insulating layer at an initial stage of said high-temperature sputtering process, and
evaporating the metal fluoride solution from the surface of the insulating layer after the initial stage.

38. The method as recited in claim 32 further comprises a step of performing a post-annealing treatment after the performing the high-temperature sputtering process, wherein the post-annealing treatment is performed at a temperature ranging from about 50° C. to 200° C. for a time period of not more than 180 seconds.

39. The method as recited in claim 32, wherein the insulating layer is formed using a radial line slot antenna microwave plasma treatment device with a predetermined setting condition.

40. The method as recited in claim 39, wherein the predetermined setting condition includes a pressure ranging from 25 mTorr to 30 mTorr with a microwave power ranging from 1500 W to 2000 W.

* * * * *

UNITED STATES PATENT AND TRADEMARK OFFICE
CERTIFICATE OF CORRECTION

| | |
|---|---|
| PATENT NO. | : 8,765,605 B2 |
| APPLICATION NO. | : 13/138242 |
| DATED | : July 1, 2014 |
| INVENTOR(S) | : Masahiro Horigome |

It is certified that error appears in the above-identified patent and that said Letters Patent is hereby corrected as shown below:

In the Specification

Column 2, line 19, please replace "(CT)" with - (C/F) -

Column 8, line 62, please add - in paragraphs [0025-0026] - between "explained" and "in"

In the Claims

Column 21, line 33, please replace "wherein step the step" with - wherein the step -

Column 22, lines 6-7, please replace "200°," with - 200°C, -

Column 24, line 7, please remove - the annealing step -

Column 24, lines 18-19, please replace "200°," with - 200°C, -

Column 24, line 37, please remove - the - between "after" and "performing"

Signed and Sealed this
Twenty-eighth Day of October, 2014

Michelle K. Lee
*Deputy Director of the United States Patent and Trademark Office*